United States Patent
O'Krafka et al.

(10) Patent No.: US 10,379,948 B2
(45) Date of Patent: Aug. 13, 2019

(54) REDUNDANCY CODING STRIPE BASED ON INTERNAL ADDRESSES OF STORAGE DEVICES

(71) Applicant: Western Digital Technologies, Inc., San Jose, CA (US)

(72) Inventors: Brian W O'Krafka, Austin, TX (US); Vladislav Bolkhovitin, San Jose, CA (US); Sanjay Subbarao, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/722,685

(22) Filed: Oct. 2, 2017

(65) Prior Publication Data
US 2019/0102250 A1    Apr. 4, 2019

(51) Int. Cl.
| G11C 29/00 | (2006.01) |
| G06F 11/10 | (2006.01) |
| G11C 29/52 | (2006.01) |
| G06F 12/109 | (2016.01) |

(52) U.S. Cl.
CPC ........ G06F 11/1068 (2013.01); G06F 12/109 (2013.01); G11C 29/52 (2013.01); G06F 2212/1032 (2013.01); G06F 2212/202 (2013.01); G06F 2212/657 (2013.01)

(58) Field of Classification Search
CPC .............. G06F 11/1068; G06F 12/109; G06F 2212/202; G06F 2212/1032; G06F 2212/657; G11C 29/52
See application file for complete search history.

(56) References Cited

U.S. PATENT DOCUMENTS

| 5,530,948 | A  | 6/1996  | Islam |
| 7,680,837 | B2 | 3/2010  | Yamato |
| 7,934,055 | B2 | 4/2011  | Flynn et al. |
| 8,473,648 | B2 | 6/2013  | Chakhaiyar et al. |
| 8,583,853 | B1 | 11/2013 | Lee et al. |
| 9,009,565 | B1 | 4/2015  | Northcott et al. |
| 9,118,698 | B1 | 8/2015  | Radovanovic |
| 9,448,924 | B2 | 9/2016  | Sundaram et al. |
| 9,720,596 | B1 | 8/2017  | Bono et al. |
| 2008/0034153 | A1 | 2/2008 | Lee et al. |
| 2009/0150605 | A1 | 6/2009 | Flynn et al. |
| 2012/0284460 | A1 | 11/2012 | Guda |
| 2013/0046949 | A1 | 2/2013 | Colgrove et al. |

(Continued)

OTHER PUBLICATIONS

U.S. Appl. No. 15/722,666, filed Oct. 2, 2017 by Bolkhovitin et al.

(Continued)

*Primary Examiner* — Samir W Rizk
(74) *Attorney, Agent, or Firm* — Patent Law Works LLP

(57) ABSTRACT

Technology disclosed herein efficiently uses memory available in non-volatile storage devices in a non-volatile memory system. In one aspect, a manager collects enough data to fill an entire chunk of a redundancy coding stripe, and requests that the entire chunk be written together in a selected non-volatile storage device. The selected non-volatile storage device may return an internal address at which the entire chunk was written. The manager may store a stripe map that identifies the internal addresses at which each chunk was stored.

20 Claims, 15 Drawing Sheets

(56) References Cited

U.S. PATENT DOCUMENTS

| | | |
|---|---|---|
| 2014/0101369 A1 | 4/2014 | Tomlin et al. |
| 2014/0365719 A1 | 12/2014 | Kuzmin et al. |
| 2015/0067244 A1* | 3/2015 | Kruger ............... G06F 12/0246 711/103 |
| 2015/0089282 A1 | 3/2015 | Taranta, II |
| 2016/0054920 A1 | 2/2016 | Patterson, III |
| 2016/0070652 A1 | 3/2016 | Sundararaman et al. |
| 2016/0320989 A1 | 11/2016 | Bromberg et al. |
| 2016/0357461 A1 | 12/2016 | Tsao et al. |
| 2016/0371145 A1 | 12/2016 | Kkutsu et al. |
| 2018/0054217 A1 | 2/2018 | Schwaderer |

OTHER PUBLICATIONS

Zhang, Jiacheng, et al., "ParaFS: A Log-Structured File System to Exploit the Internal Parallelism of Flash Devices," 2016 USENIX Annual Technical Conference, Jun. 22-24, 2016, 15 pages.

International Search Report and Written Opinion of International Application No. PCT/US2018/052376, dated Dec. 10, 2018 (13 pages).

International Search Report and Written Opinion of International Application No. PCT/US2018/052389, dated Dec. 10, 2018 (13 pages).

* cited by examiner

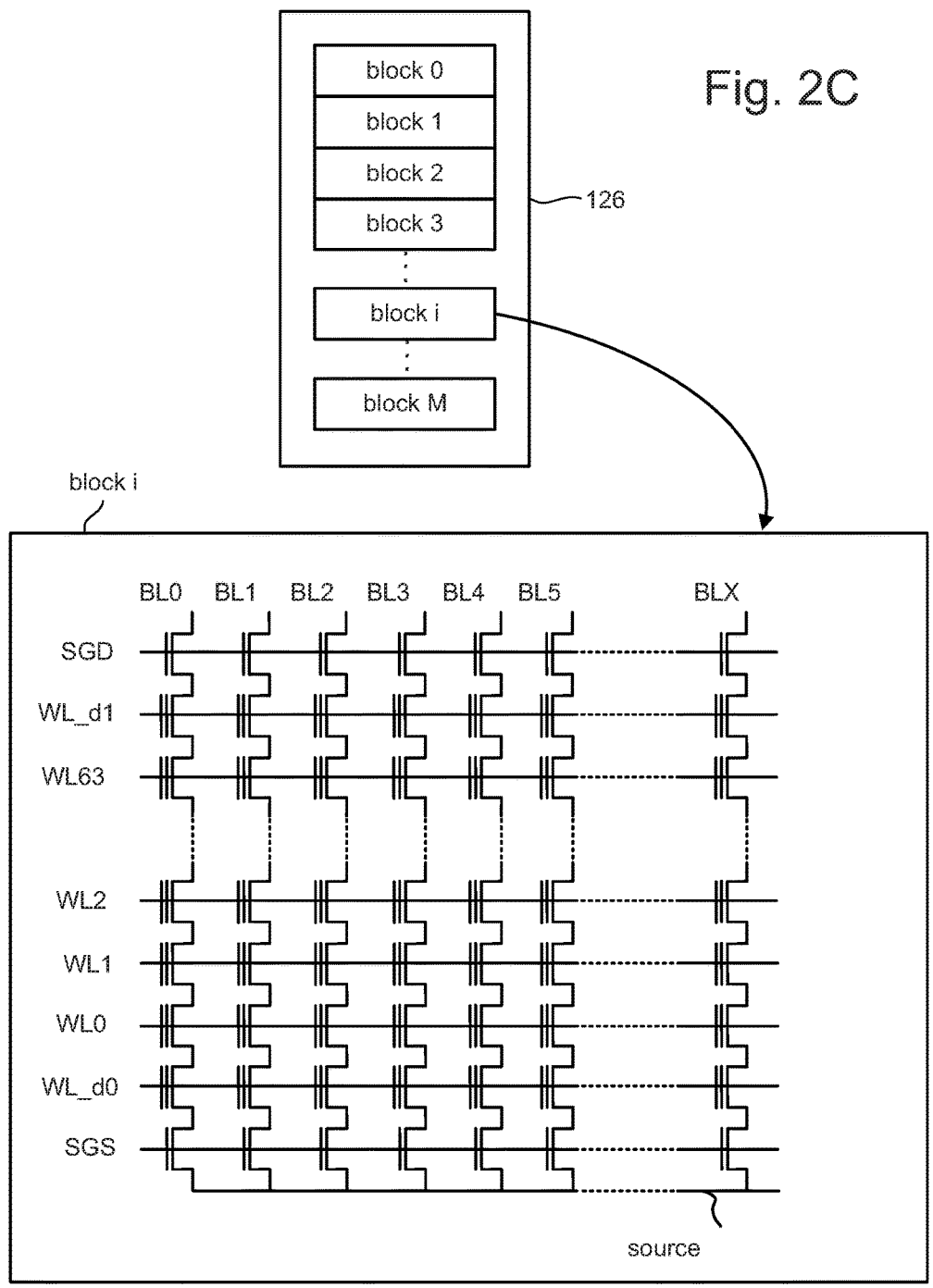

REDUNDANCY CODING STRIPE BASED ON INTERNAL ADDRESSES OF STORAGE DEVICES

BACKGROUND

The present technology relates to non-volatile memory systems.

Semiconductor memory devices have become more popular for use in various electronic devices. For example, non-volatile semiconductor memory is used in cellular telephones, digital cameras, personal digital assistants, mobile computing devices, non-mobile computing devices, solid state drives, and other devices.

A charge-storing material such as a conductive floating gate or a non-conductive charge-trapping material can be used in some types of memory cells to store a charge which represents a data state. The memory cell may be a transistor in which the charge-storing material may reside between a channel and a control gate. The charge-storing material may be insulated from both the channel and the control gate. The charge-storing material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

Some types of memory cells may be programmed by altering the charge in the charge-storing material, thereby altering the threshold voltage (Vth) of the memory cell transistor. In one technique, a program voltage is applied to the control gate with a low voltage in the channel to add charge to the charge-storing material. After applying the program voltage, the memory cell's threshold voltage is tested by applying a verify voltage to the control gate, and testing whether the memory cell conducts a significant current. Additional program voltages may be applied to control gate, followed by verify voltages, until the memory cell's threshold current is within a target range.

Other types of memory cells can be programmed to different resistance levels. For example, resistive random access memory (ReRAM) can be reversibly switched between a high resistance state and a low resistance data state. In some memory cells, a ReRAM cell can be reversibly switched between more than two different resistance states. Each resistance state can correspond to a range of resistances.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 2C depicts an exemplary structure of memory cell array.

Figure 1A:
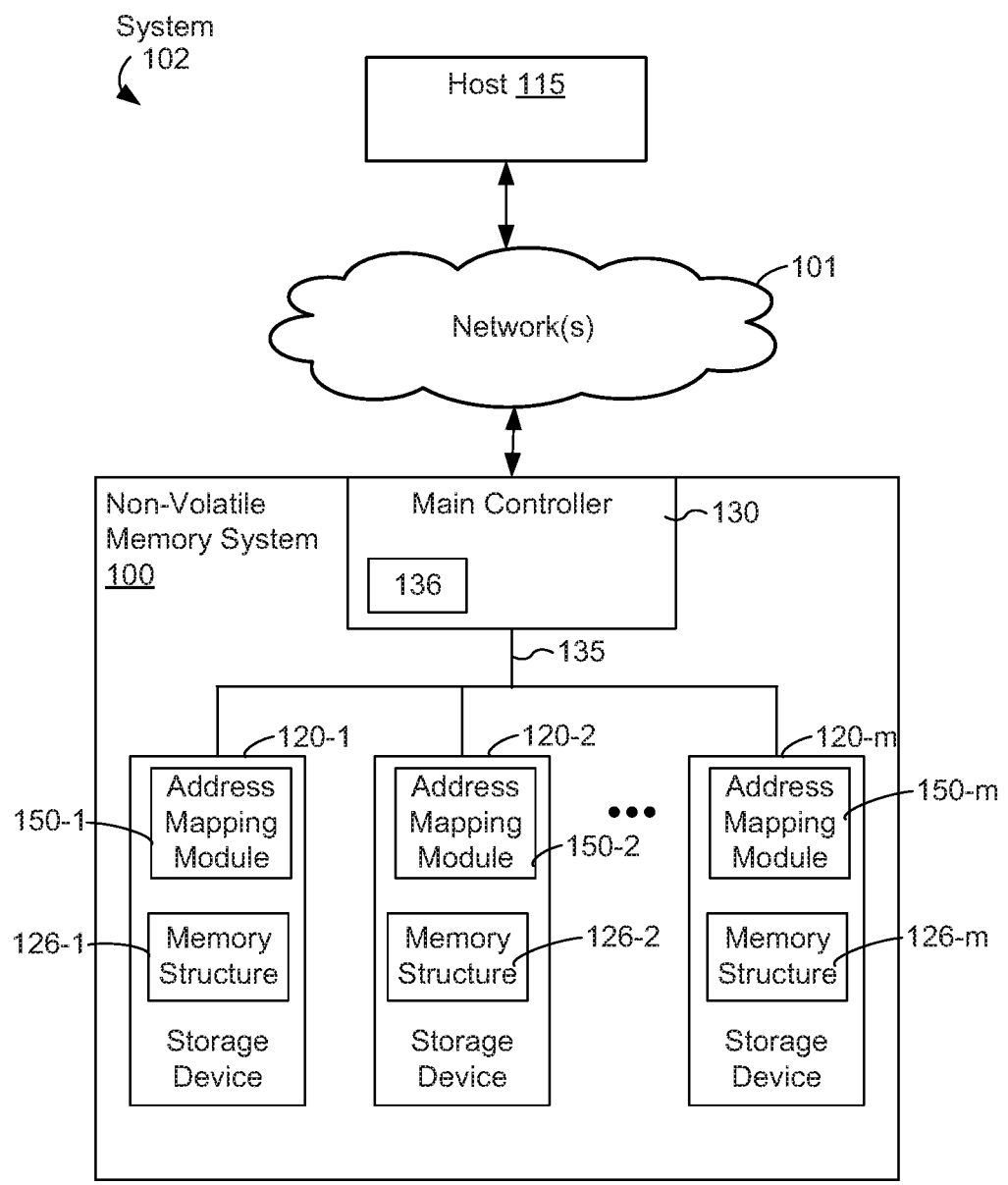
FIG. 1A is a block diagram illustrating a distributed computing system that includes a non-volatile memory system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The present technology pertains to operating non-volatile memory systems. Technology disclosed herein efficiently uses memory available in non-volatile storage devices in a non-volatile memory system.

In some embodiments, a host (or alternatively "main controller" that may be external to non-volatile storage devices within a system) has data collection logic configured to collect enough data (e.g., random writes) to fill an entire chunk of a redundancy coding stripe. The host may further have command logic configured to issue a command to write the entire chunk together in a selected non-volatile storage device. For example, the entire chunk might be written in the same erase block. The selected non-volatile storage device may return an internal address at which the entire chunk was written. The host may store a stripe map that identifies the internal addresses at which each chunk of the redundancy coding stripe was stored.

Herein, a "physical address" is a hardware address (which is typically within a non-volatile storage device). Thus, a physical address is an address of a physical location. The term "logical address," as used herein, is a pointer to a physical address. Herein, an "internal logical address" is a logical address in an address space of a non-volatile storage device that stores data associated with the logical address. The term "external logical address," as used herein, is a logical address in an address space external to a non-volatile storage device that stores the data associated with the external logical address. As one example, the external logical address could be an address in an address space of a host that requests that data associated with the external logical address be stored in the non-volatile storage device. Herein, an "internal address" is an address in an address space of a non-volatile storage device. Two examples of internal addresses are internal logical addresses and physical addresses.

Herein, "random writes" refers to a sequence of writes that do not have sequential addresses. For example, a host may issue a sequence of write commands in which the logical addresses are scattered. A sequence of random writes may thus comprise random external logical addresses. In contrast, "sequential writes," as the term is used herein, refers to a sequence of writes that do have sequential addresses. For example, a host may issue a sequence of write commands in which the logical addresses are ordered sequentially.

In some embodiments, non-volatile storage may be used to store data using redundant data-based protection schemes, sometimes called redundancy coding. One example of redundancy coding is commonly referred to as RAID (redundant array of independent disks). Numerous types or levels of redundancy coding and RAID are well known, and the present disclosure does not presume to fully describe all types or levels of Redundancy Coding and RAID.

In one embodiment, a host (or alternatively "main controller" that may be external to non-volatile storage devices) has collection logic configured to collect enough data (e.g., random writes) to fill an entire chunk of a redundancy coding stripe. The host may further have command logic configured to issue a command to write the entire chunk in a selected non-volatile storage device. The selected non-volatile storage device may return an internal address at which the entire chunk was written. In one embodiment, the entire chunk is written to a physically contiguous region of memory cells. For example, the physically contiguous region could be all or a portion of an erase block. The internal address is not necessarily a physical address. In one embodiment, this internal address will, however, remain fixed in the event that the non-volatile storage device were to move the chunk to another physical location. Herein, an internal address that will remain fixed even if the non-volatile storage device were to move the data to another physical location is referred to as a "fixed internal address." Thus, if the host is to later send a request to the storage device for data stored at the fixed internal address, the storage device will return the data even if the data was physically move to a different physical address. In one embodiment, the fixed internal address is an internal logical address.

The host (or alternatively main controller) may repeat the collection of data for other chunks of the redundancy coding stripe, and issue writes to other non-volatile storage devices. The host may thus obtain an internal address of a where each chunk was written in each of the non-volatile storage devices. The host may also compute a redundancy code for the redundancy coding stripe. An example of the redundancy code is one or more parity chunks based on the chunks written to the non-volatile storage devices. The host may forward a write command to write a chunk of the redundancy code in a selected non-volatile storage device. The selected non-volatile storage device may return an internal address of wherein the chunk of redundancy code was written. In one embodiment, the entire chunk is written to a physically contiguous region of memory cells. For example, the physically contiguous region could be all or a portion of an erase block. If the redundancy code has more than one chunk, the host may repeat this for other chunks of the redundancy code.

The non-volatile storage system may further have redundancy coding logic configured to compose a redundancy coding stripe from the chunk of data on each of the non-volatile storage devices, as well as the chunk of redundancy code in the one or more non-volatile storage devices. In one embodiment, the host (or alternatively "main controller") stores a redundancy stripe map that includes each of the internal addresses that the non-volatile storage devices provided in response to the requests to write the chunks. In one embodiment, the redundancy stripe map may identify an erase block of each of the non-volatile storage devices.

Note that a non-volatile storage device could move its chunk of the redundancy coding stripe to a different physical region on its own volition (without notifying the host or main controller). For example, the non-volatile storage device could perform wear-leveling, in which all of the data containing in a block containing the chunk is written to another region (e.g., block). The non-volatile storage device may maintain a mapping between an "internal logical address" of blocks and a "physical address" of blocks. When the data is moved from one block to another, the physical address is updated, but the internal logical address remains the same, in one embodiment. As noted, this is referred to herein as a "fixed internal address." The internal address that the non-volatile storage device reports to the host may be the internal logical address. Thus, note that the host (or main controller) is able to maintain a redundancy stripe map that defines each redundancy stripe, even if a non-volatile storage device were to physically move its chunk in one of the redundancy stripes.

Some memory systems, comprising multiple non-volatile storage devices, employ a log structured type of organization for storing data in non-volatile storage. A log-structured organization may convert write data from a host that have "temporal locality" (i.e., are performed close together in time) to a layout that has "spatial locality" on the non-volatile storage, even though the data may not be spatially local in the host address space. For example, random writes from the host may be written to the non-volatile storage sequentially in terms of physical location. Such a log structured type of organization may increase the performance of the non-volatile storage. For example, write amplification may be reduced.

One possible way to implement a log structured organization in a system with multiple non-volatile storage devices is for logic external to the non-volatile storage device within the system (e.g., solid state drive) to maintain a table that maps from one address space (e.g., virtual address space) to another address space (e.g., external logical address space). As an example, random writes in the virtual address space that occur at about the some point in time may be mapped to a sequence in the external logical address space. For the sake of discussion, the addresses will be referred to as "block addresses." Thus, the table may map virtual block addresses (VBAs) in the virtual address space to external logical block addresses (external LBAs) in the external logical address space. Such a mapping table may be referred to herein as a "write-serialization" mapping table.

One or more write commands may be sent to the non-volatile storage to write data at the sequence of external LBAs. Some non-volatile storage devices may map between the external LBA to an internal address, which may define a physical location in the non-volatile storage device. For example, the non-volatile storage device may have a data structure (e.g., logical to physical translation table) that maps external LBAs to physical block addresses (PBAs) in the non-volatile storage device. Note that some non-volatile storage devices may have an additional "internal logical address" (internal LBA) between the external LBA and the PBA. Thus, some non-volatile storage devices may map from an external LBA to an internal LBA, and also map from the internal LBA to a PBA.

However, in the system environment with multiple storage devices providing a large aggregate storage capacity, such a log structured type of organization may require a large crash-safe mapping table to map from the virtual address space to the external logical address space. For example, a large crash-safe mapping table may be needed to map from VBAs to external LBAs. Storing such a table in the non-volatile storage memory cells of the non-volatile storage device may negatively impact performance of the non-volatile storage device. One possible option is to store the mapping table in dynamic RAM (DRAM). However, given the size of the table, the cost of the DRAM could be considerable. For example, the table might need five bytes per 4 k page of storage. For example, for 1 PB of storage the table may require >1 TB of DRAM.

Additionally, the VBA to external LBA mapping may require garbage collection and/or data compaction. However, garbage collection may be resource intensive. For example, garbage collection can consume multiple CPU cores and many GBs of memory. Data compaction performs data movements via reading and then writing data blocks, hence all write amplification becomes fully visible on the data bus. Finally, parity computation additionally puts significant load on multiple CPU cores, memory bandwidth and CPU caches (via trashing them). Especially the memory bandwidth overhead is significant, because usually it is the most scarce system resource for storage applications.

Embodiments disclosed herein leverage internal capabilities of non-volatile storage devices to implement efficient logic structuring in a storage system environment. In one embodiment, logical to physical mapping tables in non-volatile storage devices are exploited to offload a host-based or storage system controller-based write-serialization mapping table. This significantly reduces the large memory requirement at the system/host level. By leveraging storage device-supported optimizations, the host software or the storage system controller could be simpler and more resources can be freed to perform compute tasks, providing significantly more performance at less cost. The entire system becomes more scalable, as the performance of write serialization mapping could be scaled linearly with the number of storage devices.

Certain embodiments of the invention can provide advantages in NVMe Over Fabric (NVMeOF) storage platforms (e.g., NVMeOF Intelligent Platform), because NVMeOF allows building of highly efficient NVMeOF controllers, which can perform tens of millions IOPS in silicone. In this context, a storage controller, however, cannot perform RAID-related tasks without significant loss of efficiency, hence becoming a single bottleneck. Offloading redundancy tasks to the storage devices would allow adding RAID/erasure coding functionality into NVMeOF storage platforms without significant loss of performance scalability. As a result, it would be possible to build highly efficient NVMeOF storage platforms, which can withstand, for instance, two drive failures with just 10% storage overhead (20+2 RAID), while having performance of 10M IOPS or more on small blocks random writes with very limited cost increment, as compared to direct attached storage (DAS) storage devices of the same aggregate capacity and performance.

In one embodiment, a non-volatile storage device has mapping logic configured to map external LBAs in write requests that are received sequentially in time to sequential addresses in an internal address space of the non-volatile storage device. The mapping logic may be configured to store the mapping in the non-transitory storage. As one example, the mapping logic could store a logical to physical translation table in non-transitory storage. In one embodiment, mapping logic of a given non-volatile storage device is configured to map random external logical addresses in write requests that are received sequentially in time at the given non-volatile storage device to physically contiguous locations in the given non-volatile storage device. In one embodiment, mapping logic of a given non-volatile storage device is configured to map random external logical addresses in write requests that are received sequentially in time at the given non-volatile storage device to sequential internal addresses of the given non-volatile storage device.

FIG. 1A is a block diagram illustrating a distributed system 102 that includes an implementation of a non-volatile memory system 100, coupled over a network 101 to a host system 115 (sometimes called host computer system, host device, or host) in accordance with some embodiments. Note that there may be more than one host system 115 connected to the non-volatile memory system 100. Non-volatile memory system 100 includes non-volatile storage devices 120-1 to 120-*m* (also sometimes called an information storage device, or a data storage device, or a memory device).

In some embodiments, storage devices 120 include any number (i.e., one or more) of memory devices including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

Storage devices 120 include a memory structure 126. In one embodiment, the memory structure 126 contains flash memory cells (e.g., NAND or NOR). However, the memory structure 126 is not limited to flash memory cells. Other examples for memory structure 126 include resistive random access memory ("ReRAM"), ferroelectric random access memory ("FRAM"), and magnetoresistive random access memory ("MRAM").

The memory structure 126 can be two-dimensional (2D) or three-dimensional (3D). The memory structure may comprise one or more arrays of memory cells. The memory structure may comprise a monolithic 3D memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

In FIG. 1A, host system 115 is coupled to a main storage controller 130 of non-volatile storage system 100 through network 101. However, in some embodiments host system 115 includes a storage controller, or a portion of main storage controller 130, as a component and/or as a subsystem. For example, in some embodiments, some or all of the functionality of storage controller 130 is implemented by software or hardware within host system 115. Within the illustrative non-volatile memory system 100, a main controller 130 is coupled to network 101 and to one or more storage devices 120 through connections 135. Main controller 130 is a controller for controlling access to storage devices 120 and bi-directional processing of read and write commands and associated data between networked host system 115 and storage devices 120, such as solid state disk drives (SSDs). The controller 130 may be a non-volatile memory express (NVMe) controller, a Redundancy Coding controller (e.g., a redundant array of independent disks (RAID) controller), or another type of CPU or processor for controlling access to non-volatile storage devices. In some embodiments, however, controller 130 and storage devices 120 are included in the same device (i.e., an integrated device) as components thereof. Furthermore, in some embodiments, storage devices 120 are embedded in a host device (e.g., computer system 115), such as a mobile device, tablet, other computer or computer controlled device, and the methods described herein are performed, at least in part, by the embedded storage controller.

In FIG. 1A, the main controller 130 includes a redundancy coding module 136. However, redundancy coding module 136 could be located in one of the storage devices 120 or host 115. The redundancy coding module 136 may be configured to compose redundancy coding stripes. In one embodiment, each of the redundancy coding stripes is formed from a chunk of data on each of the non-volatile storage devices 120. In one embodiment, each of the redundancy coding stripes is formed based on internal addresses at which the non-volatile storage devices 120 reported chunks of the stripes were stored. For example, the main controller 130 or host 115 could store a redundancy stripe map that contains, for each redundancy coding stripe, the internal addresses at which each chunk of a redundancy coding stripe was stored.

Host computer system 115 may be any suitable computer device, such as a computer, a laptop computer, a tablet device, a netbook, an internet kiosk, a personal digital assistant, a mobile phone, a smart phone, a gaming device, a computer server, or any other computing device. In some embodiments, host system 115 is a server system, such as a server system in a data center. In some embodiments, a host system 115 includes one or more processors, one or more types of memory, a display and/or other user interface components such as a keyboard, a touch-screen display, a mouse, a track-pad, a digital camera, and/or any number of supplemental I/O devices to add functionality to host computer system 115. In some embodiments, host computer system 115 does not have a display and other user interface components.

The storage devices 120 each include a memory structure 126 and an address mapping module 150. The address mapping module 150 may be configured to translate (or map) an address from an address space of the host 115 or an address space maintained by the main controller 130 at the system level (an external address space, as it is external to the storage device) to an internal address space of the storage device 120. The address mapping module may also be configured to store the mapping in non-transitory storage. In one embodiment, the non-transitory storage is DRAM. As one example, the address mapping module 150 could include an external logical address to physical address translation table, which may map from an external logical address provided by the main controller 130 to a physical address of the storage device 120. In one embodiment, the mapping module 150 maps from an external logical address to an internal logical address, as well as from the internal logical address to a physical address. Thus, the external logical address may be mapped to the physical address, via the internal logical address. In one embodiment, the main controller 130 translates an address space used by the host 115 (virtual block addresses) to the external logical address space the controller 130 provides to the individual storage devices 120. In certain embodiments where the host communicates with the storage devices 120 without a main controller, the translation of virtual block address to external logical address can be performed by the host.

Figure 1B:
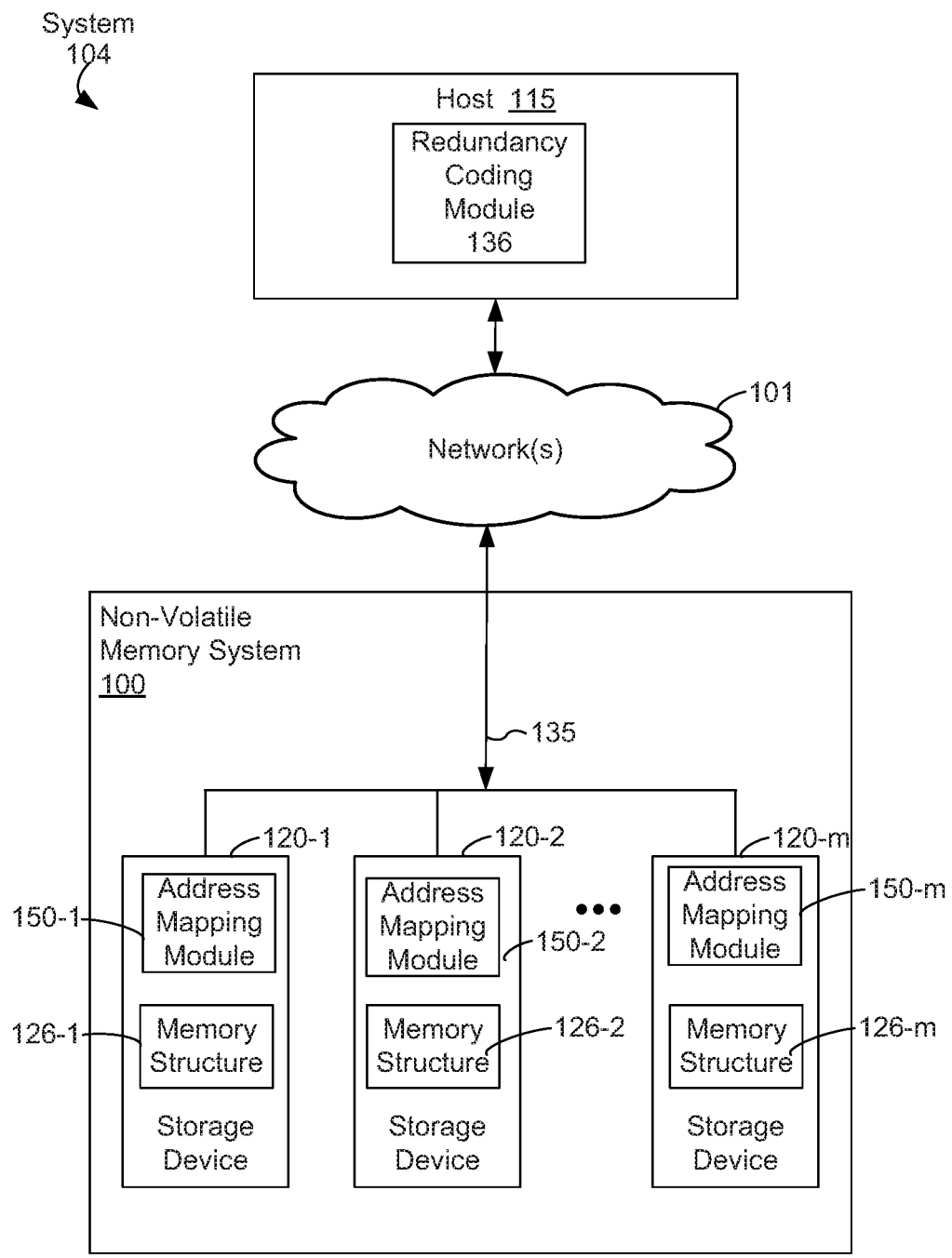
FIG. 1B is a block diagram illustrating a distributed computing system that includes one or non-volatile storage devices, in accordance with some embodiments.

FIG. 1B depicts another example system 104 in which embodiments may be practiced. In FIG. 1B, host system 115 is in communication with the storage devices 120 thorough network(s) 101 and connections 135. Network 101 and connections 135 are sometimes called data connections, but typically convey commands in addition to data, and optionally convey metadata, error correction information and/or other information in addition to data values to be stored in storage devices 120 and data values read from storage devices 120. In FIG. 1B, the host system 115 includes a redundancy coding module 136. However, redundancy coding module 136 could be located in one of the storage devices 120.

Figure 2A:
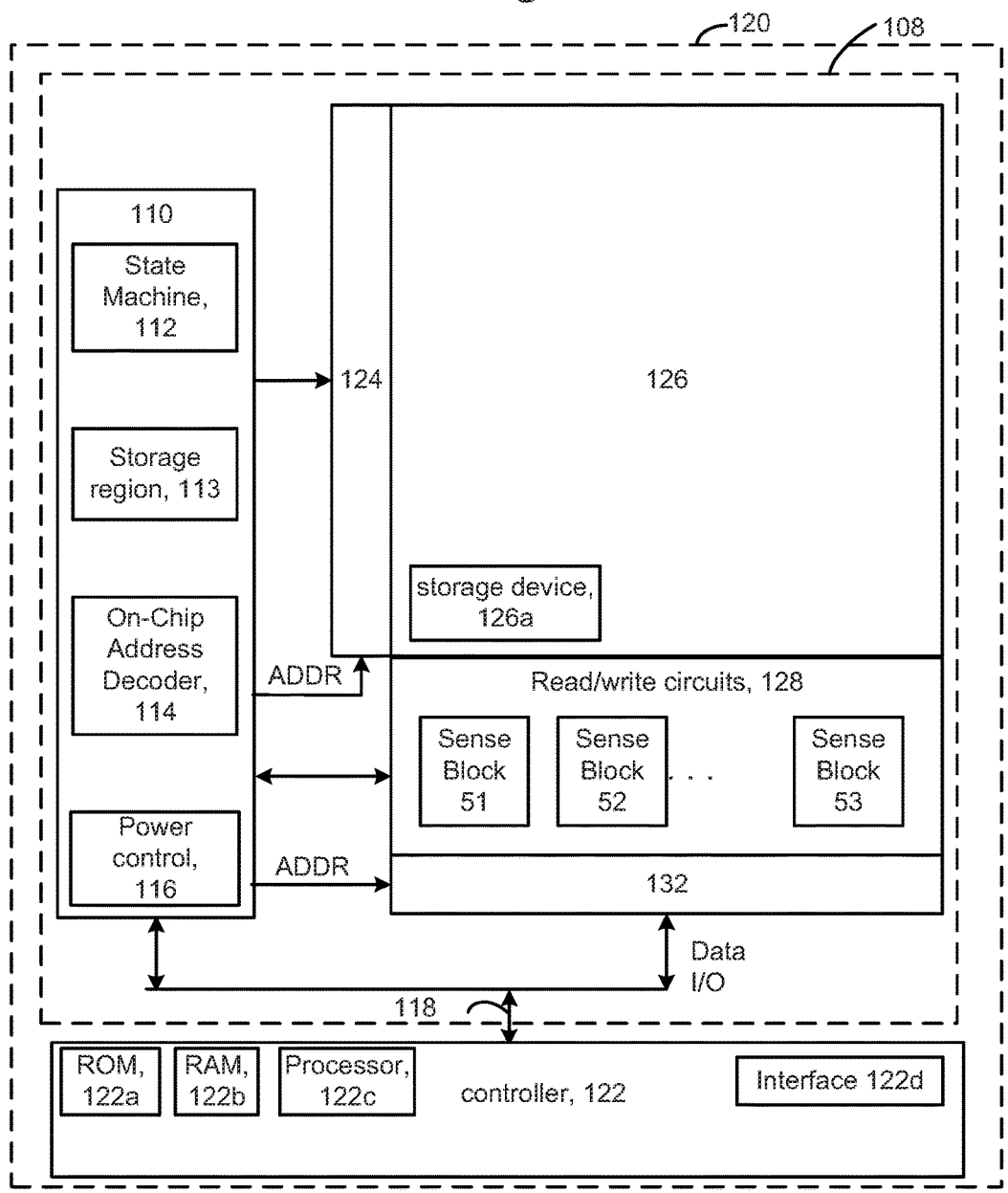
FIG. 2A is a block diagram of an example storage device in which embodiments may be practiced.

FIG. 2A is a block diagram of an example storage device 120 in which embodiments may be practiced. The storage device 120 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory system 100 (e.g., a removable storage card) as the one or more memory die 108. The controller may be separate from the memory die. Commands and data are transferred between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to word lines, select gate lines, bit lines and source lines during embodiments of memory operations. It can include drivers for word lines, SGS and SGD transistors and source lines. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth. The control circuit may also be referred to as a managing circuit.

The off-chip controller 122 (which in one embodiment is an electrical circuit) may comprise a processor 122c, storage devices (memory) such as ROM 122a and RAM 122b. In some embodiments, the RAM 122b is used to store one or more address mapping data structures (such as, but not limited to, an address mapping table). In general, an address mapping data structure maps between two addresses. In one embodiment, an address mapping data structure maps between an external logical address and an internal logical address. In one embodiment, an address mapping structure maps between an internal logical address and a physical address. Examples of address mapping data structures include, but are not limited to, address translation tables, B-trees, and log-structured merge trees.

In some embodiments, storage device area 126a is used to persist a copy of an address mapping data structure. Note that the persisted copy could be an address mapping data structure from this storage device 120 or another storage device 120. Thus, the persisted copy could be used in that event that another storage device 120 could not access its copy of its address mapping data structure in, for example, its RAM 122b (or another location).

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device area 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

The memory cells can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2B:
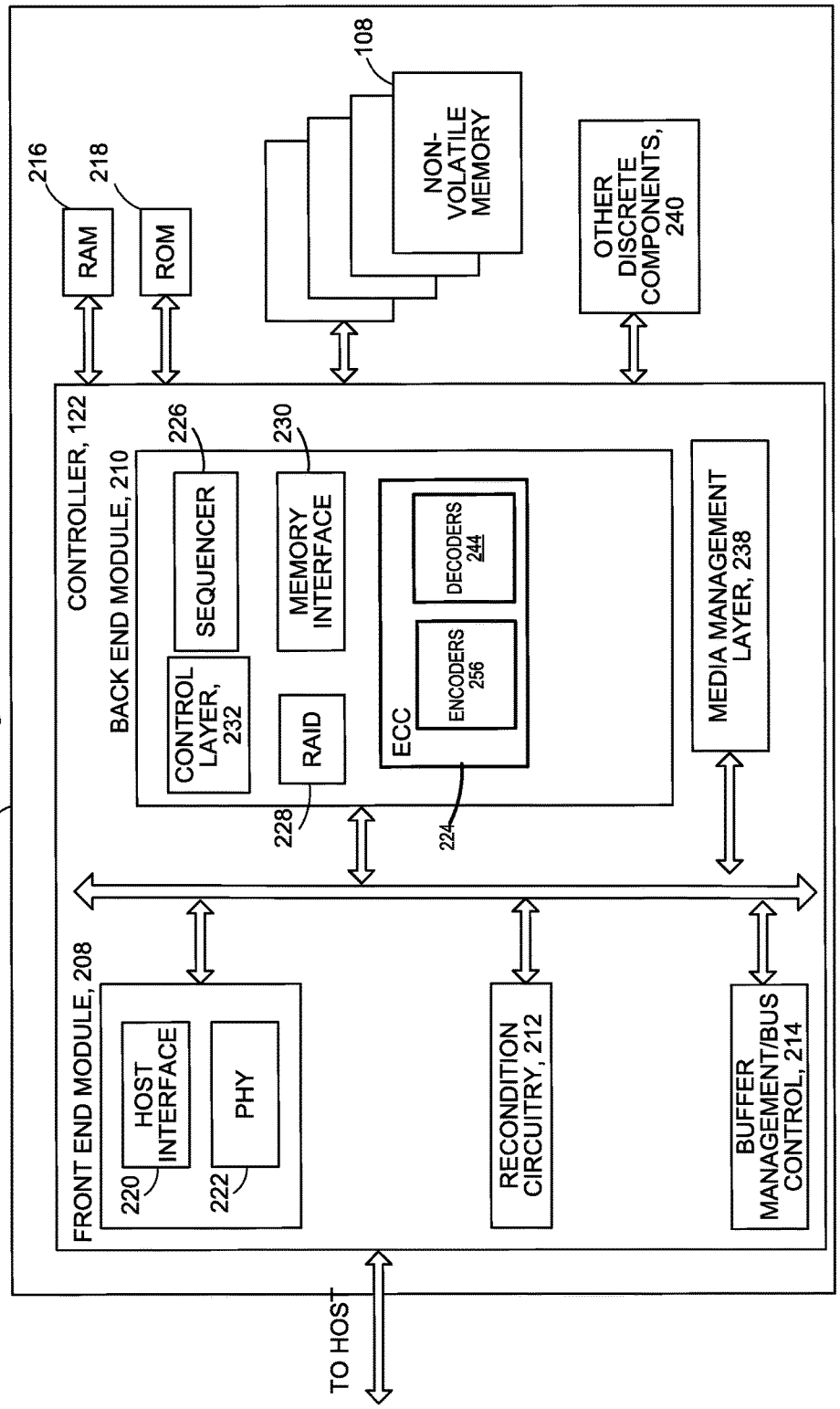
FIG. 2B is a block diagram of the example storage device, depicting additional details of a controller 122 of FIG. 2A.

FIG. 2B is a block diagram of the example storage device 120, depicting additional details of the controller 122. In one embodiment, the controller 122 is a flash controller. As used herein, a memory controller is a device that manages data stored in memory. A memory controller may communicate with a host, such as a computer or electronic device. Note that in the context of the various embodiments described herein, the "host" in the description of FIG. 2B may refer to a controller of a storage system, such as the main controller 130 shown in FIG. 1A. However, there may be an intermediary between the memory controller and host. A memory controller can have various functionality in addition to the specific functionality described herein. For example, the memory controller can format the memory to ensure the memory is operating properly, map out bad memory cells, and allocate spare memory cells to be substituted for future failed cells. Some part of the spare cells can be used to hold firmware to operate the memory controller and implement other features. In operation, when a host needs to read data from or write data to the memory, it will communicate with the memory controller. If the host provides a logical address to which data is to be read/written, the memory controller can convert the logical address received from the host to a physical address in the memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable interface. In one embodiment, memory system 100 may be a card based system, such as a secure digital (SD) or a micro secure digital (micro-SD) card. In an alternate embodiment, the memory system may be part of an embedded memory system. For example, the memory may be embedded within the host, such as in the form of a solid state disk (SSD) drive installed in a personal computer.

In some embodiments, the storage device 120 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2B is one example implementation that may (or may not) use the components of the controller 122 depicted in FIG. 2A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2B as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. Note that the host interface 220 is used to communicate with main controller 130, in one embodiment. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. The ECC engine 224 has one or more decoders 244 and one or more encoders 256. In one embodiment, the ECC engine 224 comprises a low-density parity check (LDPC) decoder. In one embodiment, the decoders 244 include a hard decoder and a soft decoder. An output of one or more decoders 244 may be provided to the host.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A control layer 232 controls the overall operation of back end module 210.

Additional components of storage device 120 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Media Management Layer (MML) 238 may be integrated as part of the management that may handle errors and interfacing with the host, or the main controller 130. In one embodiment, MML 238 is a Flash Translation Layer (FTL), and corresponds to the address mapping module 150-1 to 150-m depicted in the earlier figures. MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines). The MML 238, which corresponds to the address mapping module 150 of FIG. 1A, in one embodiment is configured to map between an external address in commands received via host interface 220 to an internal address used by the device 120. The MML 238 is configured to store one or more address mapping structure in non-transitory storage, in one embodiment. Examples of non-transitory storage include, but are not limited to, RAM 216, ROM 218, and non-volatile memory cells in the non-volatile memory die 108.

The controller 122 may interface with one or more memory dies 108. In one embodiment, the controller and multiple memory dies (together comprising the memory system 100) implement a solid state drive (SSD), which can emulate, replace or be used instead of a hard disk drive inside a host, as a network-attached storage (NAS) device, and so forth. Additionally, the SSD need not be made to work as a hard drive.

FIG. 2C depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller calculates the ECC parity when data is being programmed into the array, and also checks it when data is being read from the array. Alternatively, the ECCs and/or other overhead data are stored in different pages, or even different blocks, than the user data to which they pertain. Note that the term "erase block" is used herein to refers to the minimum number of memory cells that are erased together. Thus, the blocks in FIG. 2C are one embodiment of erase blocks. An erase block may contain "data blocks." In some embodiments, a data block is formed by one or more pages. A data block may comprise a contiguous group of memory cells.

FIG. 2C also shows more details of block i of memory array 126. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 3:
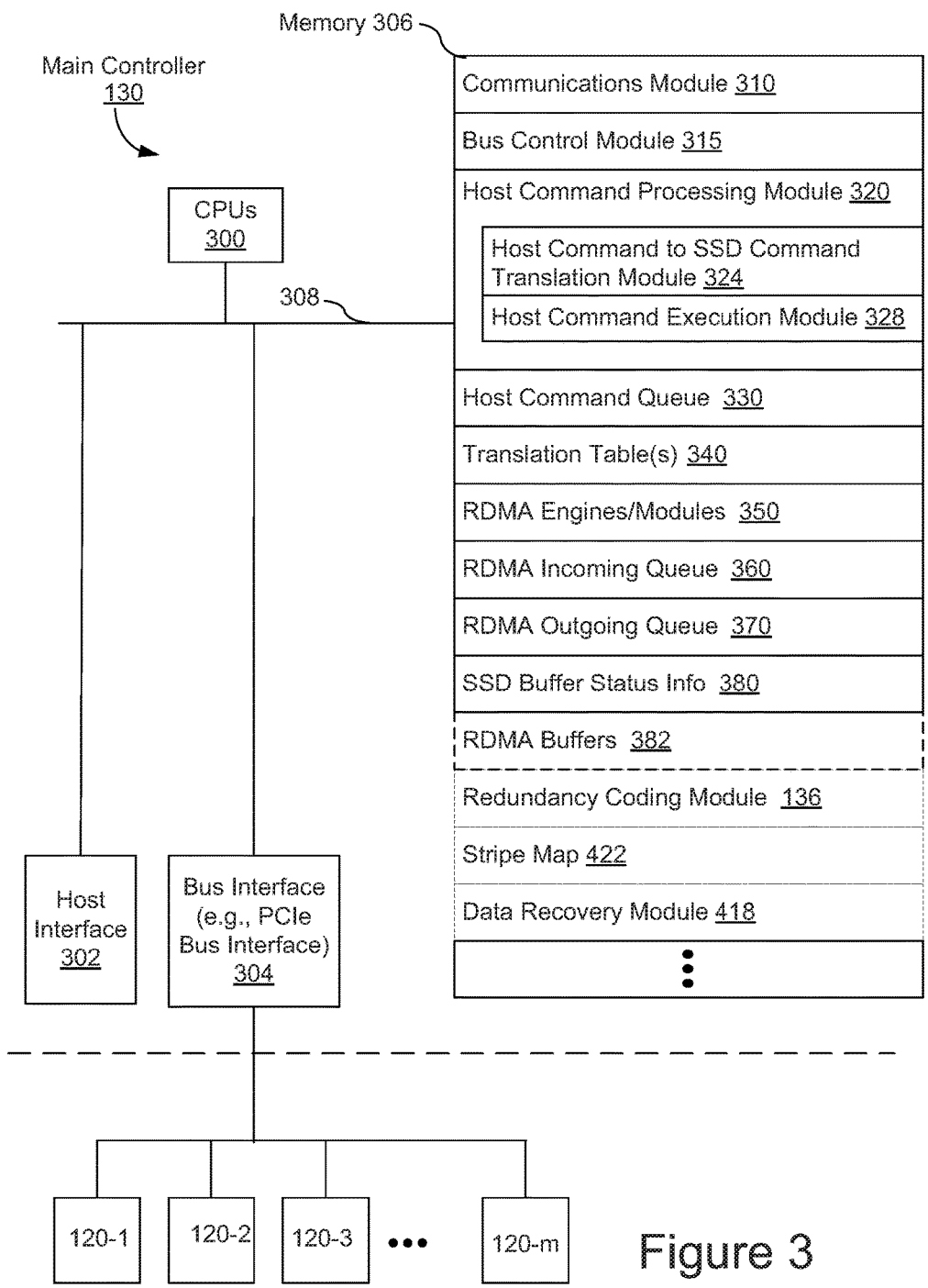
FIG. 3 is a block diagram illustrating an implementation of a main controller, in accordance with some embodiments.

FIG. 3 is a block diagram illustrating an implementation of a main controller 130, in accordance with some embodiments. In some embodiments, main controller 130 includes one or more processors 300, sometimes called CPUs, or hardware processors, or microcontrollers; host interface 302 for coupling main controller 130 to one or more host systems 115 (FIG. 1A or 1B); bus interface 304 for coupling main controller to one or more communication busses (e.g., connections 135, FIG. 1A or 1B); memory 306 (sometimes herein called controller memory); and one or more communication buses 308 for interconnecting these components. Communication buses 308 optionally include circuitry (sometimes called a chipset) that interconnects and controls communications between system components.

Main controller 130 generally facilitates getting data into and out of non-volatile memory in storage devices 120. Main controller 130 exchanges data over network 101 with host systems 115 via host interface 302. In some embodiments, main controller 130 may include a Redundancy Coding controller (e.g., a RAID controller) for storing and accessing data in an array of storage devices (e.g., storage devices 120). The one or more processors 300 execute modules, programs and/or instructions stored in memory 306 and thereby perform processing operations. In some embodiments, the one or more processors 300 are coupled to storage devices 120 by communication buses 308. In other embodiments the coupling is indirect through, for example, bus interface 304, such as a PCI Express-based bus interface (e.g., NVMe). Other bus interfaces, including a SATA or SAS bus interface may also be used.

Memory 306 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 306 optionally includes one or more storage devices remotely located from processor(s) 300. Memory 306, or alternately the non-volatile memory device(s) within memory 306, comprises a non-transitory computer readable storage medium. In some embodiments, memory 306, or the computer readable storage medium of memory 306 stores the following programs, modules, and data structures, or a subset or superset thereof: communications module 310, one or more host command queues 330; translation tables 340; RDMA engines 350; RDMA incoming queue 360 and RDMA outgoing queue 370; and/or SSD buffer status information table or data structure 380. Some of these engines/modules can be implemented in hardware circuitry and/or a combination of firmware/software and hardware circuitry.

Communications module 310 may be used for communicating with other components, such as storage devices 120, and host computer systems 115. Bus control module 315 may be used for executing bus protocols and transferring data over busses between components.

Host command processing module 320 may receive read and write commands from host system 115, allocate storage buffers in storage devices, and translate the host commands into storage device commands to facilitate remote DMA transfers of data corresponding to the read and write commands between host buffers on host systems 115 and storage buffers on associated storage devices 120. To facilitate the translation of host commands, host command processing module 320 may include a host command to SSD command translation module 324, which converts host write and read commands into commands suitable for execution by storage device 120, and optionally facilitates virtualizing addresses embedded in the host commands. Host command processing module 320 may further include a host command execution module 328 that facilitates executing received host commands, for example by setting up and executing remote DMA data transfers, and sending translated storage device commands to respective storage devices 120 for execution.

The one or more host command queues 330 may be used to track commands received from host 115 and their associated translated commands, Translation tables 340 may be used in some embodiments to translate addresses or name spaces in the received host commands into storage device identifiers or storage device addresses.

RDMA engines 350 may be used in some embodiments to transfer data between a host buffer and one or more allocated storage buffers associated with one or more storage devices 120. The RDMA engines 350 in some embodiments use translated commands, addresses and/or buffer pointers associated with translated commands to accomplish remote direct memory access (RDMA) operations; each RDMA engine 350, once configured with pointers to host and storage device buffers and a counter or other indicator of the quantity of data to be transferred, transfers data between designated host buffers and storage buffers independently of the one or more processors 300.

RDMA incoming queue 360 and RDMA outgoing queue 370 may be used to facilitate RDMA operations. Host command processing module 320 and RDMA engines 350 may use RDMA incoming queue 350 and RDMA outgoing queue 370 to keep track of read operations and write operations that have not yet completed, in accordance with some embodiments.

SSD buffer status information table or data structure 380 may be used to facilitate the allocation of storage buffers in storage device 120, host command processing module 320 uses an SSD or storage device status information table or data structure 380 to keep track of which storage buffers have been allocated and which are available for allocation, in accordance with some embodiments.

In some embodiments, memory 306 of main controller 130 also includes one or more RDMA buffers 382, for temporarily storing data or information being transferred between a host and an SSD or storage device.

Optionally, memory 306 of main controller 130 further includes redundancy coding module 136 for determining the non-volatile storage devices 120 in which to store data and parity information for any given write command or set of write commands, for example when using a particular Redundancy Coding level (e.g., any predefined RAID level such as RAID0 to RAID6, RAID10, RAID01, and so on). In some embodiments, redundancy coding module 136 works in conjunction with a stripe map 352 or stripe function for determining the particular storage devices in which to store data and parity when performing any specified write operation or set of write operations. In some embodiments, main controller 130, when sending a parity generation command to a particular storage device 120, to generate parity data for specified data, also provides to that storage device a stripe map or other data structure so that the storage device knows which other storage device to forward the specified data to for storage.

In some embodiments, memory 306 of main controller 130 further includes a data recovery module 390, for recovering data when a storage device 120 fails or more generally when the data in a portion of a stripe cannot be read from the information stored in the storage device 120 storing that portion of the stripe.

Each of the above identified elements may be stored in one or more of the previously mentioned memory devices that together form memory 306, and corresponds to a set of instructions and data for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 306 may store a subset of the modules and data structures identified above. Furthermore, memory 306 may store additional modules and data structures not described above. In some embodiments, the programs, modules, and data structures stored in memory 306, or the computer readable storage medium of memory 306, provide instructions for implementing respective operations in the methods described below with reference to FIGS. 4, 6, and 8.

Although FIG. 3 shows a main controller 130, FIG. 3 is intended more as a functional description of the various features which may be present in a main controller, or non-volatile memory controller, than as a structural schematic of the embodiments described herein. In practice, and as recognized by those of ordinary skill in the art, items shown separately could be combined and some items could be separated. Further, as noted above, in some embodiments, one or more modules of main controller 130 are implemented by one or more modules of host computer system 115, or as part of a storage device 120.

Figure 4:
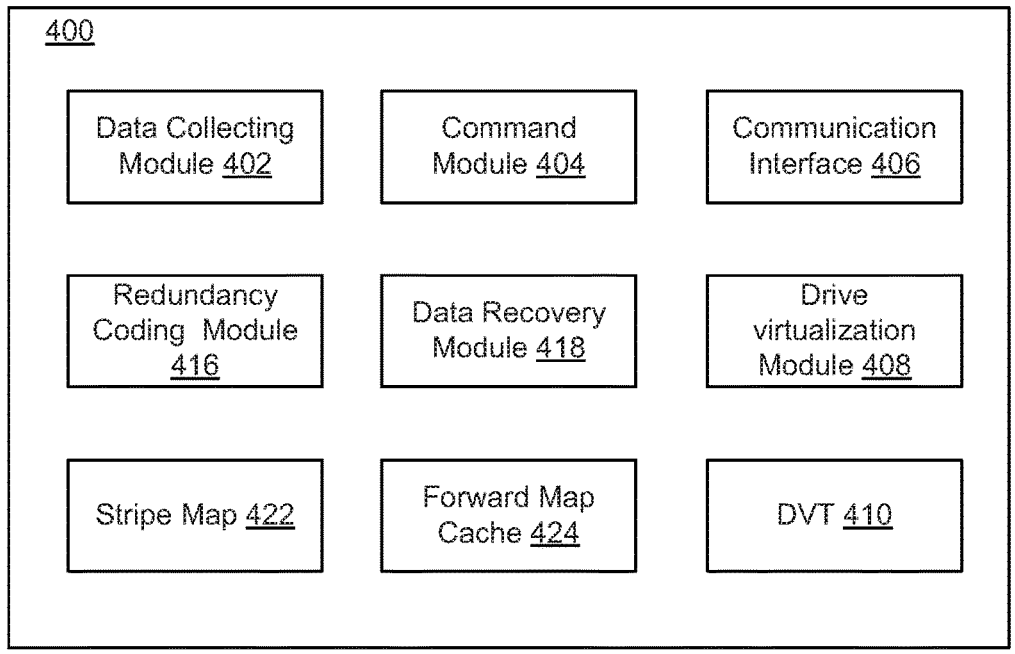
FIG. 4 is a block diagram of one embodiment of a manager system.

FIG. 4 is a block diagram of one embodiment of a manager system 400. Manager system 400 is, in one embodiment, part of main controller 130 in FIG. 1A. Manager system 400 is, in another embodiment, part of host 115 in FIG. 1B. However, the manager system 400 is not limited to thereto. Manager system 400 includes data collecting module 402, command module 404, communication interface 406, redundancy coding module 416, data recovery module 418, drive virtualization logic 408, drive virtualization table 410, stripe map 422, and forward map cache 424.

Figure 5A:
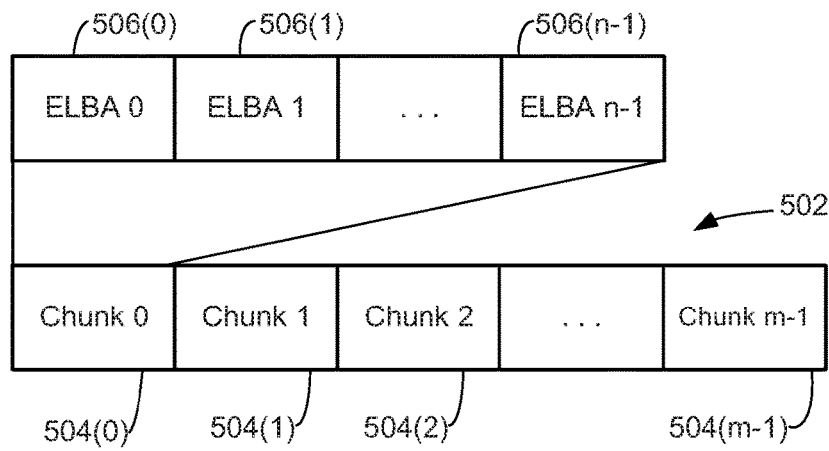
FIG. 5A is an example of a redundancy coding stripe.

In some embodiments, the manager system 400 may collect data for chunks in a redundancy coding stripe. Referring briefly to FIG. 5A, a redundancy coding stripe 512 is depicted. The redundancy coding stripe 512 contains "m" chunks of data 504(0) through 504($m-1$). In one embodiment, each chunk 504 is written to a different non-volatile storage device 120. One or more of the chunks may contain a redundancy code (e.g., parity chunk for the stripe). The data for chunk 504(0) is represented by data blocks 506(0) through 506(n−1).

Each data block 506 is associated with an external logical block address (ELBA). For example, data block 506(0) is associated with ELBA 0, data block 506(1) is associated with ELBA 1, and data block 506(n−1) is associated with ELBA n−1. The ELBAs for a chunk 504 may be random addresses. As defined herein, random addresses are not ordered sequentially. In other words, the data for a given chunk may be random data. However, the data in a chunk could be sequential instead of being random. That is, the ELBAs 506 could be ordered sequentially. It is possible that for some chunks 504 the data is random and for other chunks the data is sequential. It is possible that within a chunk 504 some of the data is random and some is sequential.

Referring again to FIG. 4, the data collection module 402 may be configured to collect data for chunks in a redundancy coding stripe. The command module 404 may be configured to send a command to write a chunk of data of a redundancy coding stripe in a selected non-volatile storage device 120. The command may indicate that the entire chunk is to be written in a contiguous group of memory cells, such as in an entire erase block or a contiguous portion of an erase block.

In some embodiments, the selected non-volatile storage device 120 returns an internal address at which the chunk was stored. This may be what is referred to herein as a "fixed internal address." As discussed above, the fixed internal address may be an address in an address space of the non-volatile storage device 120 (as opposed to, for example, an ELBA). Moreover, if the manager 400 later sends a request to read a chunk of data at the fixed internal address, the selected non-volatile storage device 120 will return the chunk of data that it stored when it provided the fixed internal address, even if the selected non-volatile storage device 120 physically moved the data to another location in the selected non-volatile storage device 120. The communication interface 406 may be configured to receive the fixed internal address. The manager 400 may save the fixed internal address in the event that the manager wishes to obtain or modify the data chunk.

Figure 5B:
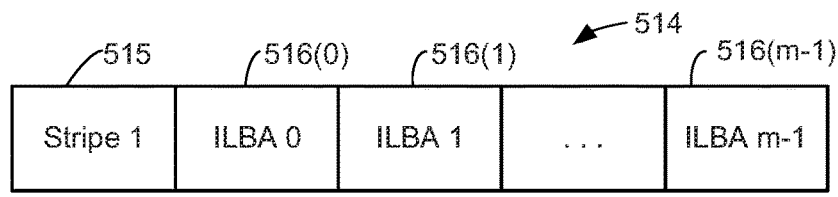
FIG. 5B depicts an example of one entry in a stripe map.

The redundancy coding module 416 may be configured to compose redundancy coding stripes. The redundancy coding module 416 stores a stripe map 422 in non-transitory storage, in one embodiment. FIG. 5B depicts an example of one entry 514 in a stripe map 422. The entry 514 contains a redundancy stripe identifier 515, which in this case is "stripe 1." The entry 514 contains an internal logical block address (ILBA) 516 for each chunk of the stripe (Stripe 1). For example, ILBA 516(0) is the internal address for chunk 504(0) that is stored on storage device 120(1). In one embodiment, the ILBA references the internal erase block of the particular storage device to which the data was written.

The data recovery module 418 may be configured to recover a chunk of data of a redundancy coding stripe based on other chunks of the redundancy coding stripe. In one embodiment, the data recovery module 418 accesses a persistent version of a forward map that is stored in non-volatile storage of a storage device 120 to assist in data recovery. Further details are discussed below.

In some embodiments, there is a virtual address space that may contain virtual block addresses (VBAs). A virtual block address has an ELBA and one or more drive bits, in one embodiment. In one embodiment, the drive virtualization table (DVT) 410 contains a mapping from the VBA to one of the storage devices 120. When a write to a VBA is received, the drive virtualization module 408 may determine a storage device 120 to which the write should be sent. The drive virtualization module 408 may create (or update) an entry in the DVT 410 that links the VBA to a unique identifier for the storage device 120. In one embodiment, the DVT 410 includes an address mapping table that maps from VBA to a storage device. Note that this unique identifier is not necessarily the drive bits in the VBA. However, one option is to simply use the drive bits in the VBA to identify the storage device 120 to be written.

The forward map cache 424 may contain a copy of a portion of the forward map, which maps VBA to stripe ID (SID). The forward map, in one embodiment, is a table of SID entries, indexed by VBA and used in error recovery, as will be explained later. For example, a read at a VBA may return an error, and the VBA triggering the error may then be used as an index to look up the SID in the forward map, and thus the stripe containing the error can be located. With the stripe located, the error recovery can thus be initiated, with the help of the stripe map to be described later. Because the forward map is only needed for error handling, in one embodiment only a portion of it is cached.

In some embodiments, modules 402, 404, 416 and/or 418 may be stored in non-transitory storage (such as memory 306 in FIG. 3 or storage 910 or working memory 940 in FIG. 9) and may correspond to a set of instructions and data for performing a function described above. These instructions may be executed on a processor (e.g., CPU 300 in FIG. 3 or processor 990 in FIG. 9). The above identified modules or programs (e.g., sets of instructions) need not be implemented as separate software programs, procedures or modules, and thus various subsets of these modules may be combined or otherwise re-arranged in various embodiments. In some embodiments, the programs, modules, and data structures provide instructions for implementing respective operations in the methods described below with reference to FIGS. 6 and 8.

Figure 5C:
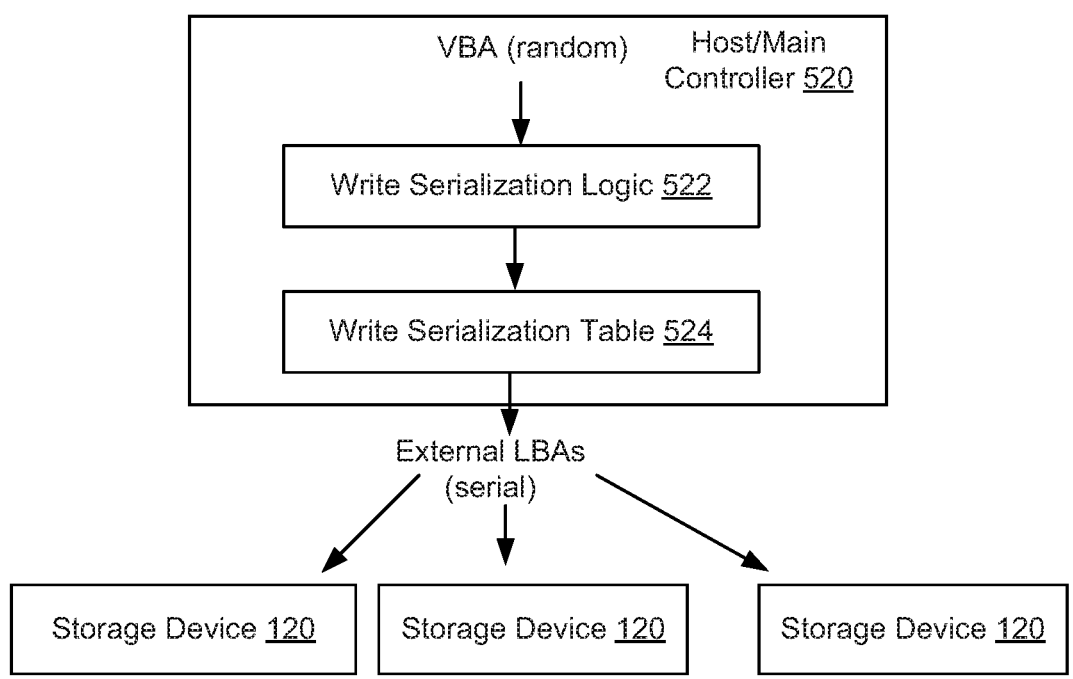
FIG. 5C depicts an example of a conventional system having a large write serialization table external to the storage device.

Some embodiments obviate the need for a large crash-safe write serialization table external to the storage devices 120 within a storage system such as storage system 100 in FIG. 1A. FIG. 5C depicts an example of a conventional system having a large write serialization table 524 external to the storage devices 120. The large write serialization table 524 could be in a host system or a main controller of a storage system coupled to a host system, for example. The host/main controller 520 has write serialization logic 522 that is configured to serialize random virtual block addresses (VBAs) into serial external logical block addresses (LBAs). Note that VBAs and ELBAs are for writes to be performed in the storage devices 120. For example, VBAs that are spread randomly across a virtual address space spanning storage devices 120, but that are for writes that occur sequentially in time, may be converted to a sequence of external LBAs. The sequence of external LBAs may be sent to the storage devices 120. The write serialization logic 502 stores a mapping from the VBAs to LBAs in the write serialization table 504.

Note that the write serialization table 524 may need to be extremely large in a storage system with many storage devices. For example, a conventional write serialization table 524 may need five bytes per every 4 KB stored in the non-volatile storage devices (assuming 4 KB page sizes). For example, if the non-volatile storage devices have an aggregate capacity of 1 petabyte (PB), the write serialization table 524 may need to be over 1 terabyte (TB) in size. The cost to store the write serialization table 524 in DRAM in the host could be extremely high.

Figure 5D:
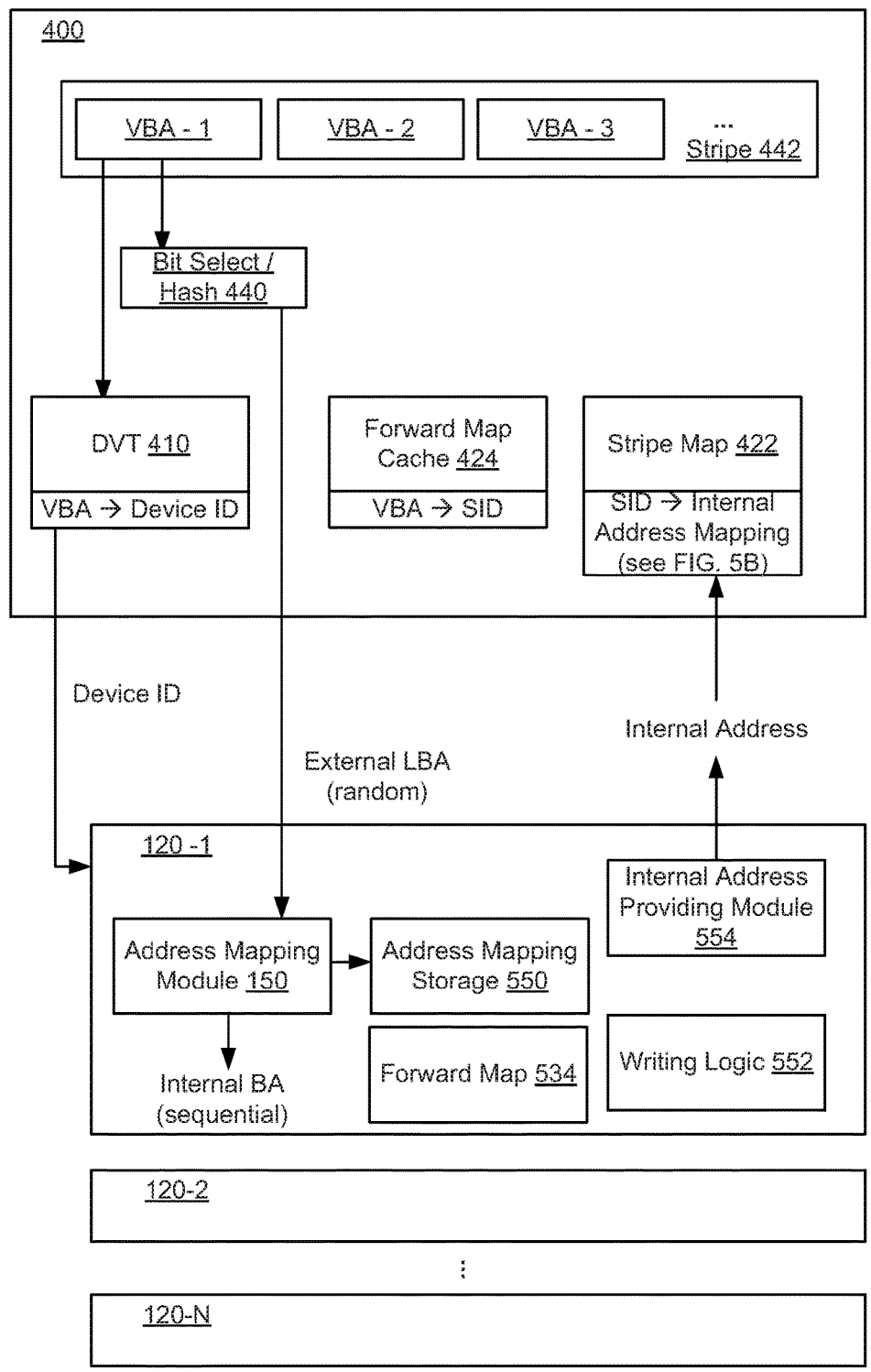
FIG. 5D is a block diagram of one embodiment of a non-volatile storage device that obviates a need for a write serialization table external to the storage device.

Embodiments disclosed herein obviate the need to have a write serialization table 524 external to the storage device 120. Instead, in some embodiments, the mapping associated with the write serialization is off-loaded to the storage devices 120. FIG. 5D is a block diagram of one embodiment of a configuration of a host/main controller with a plurality of non-volatile storage devices 120 that obviates a need for a write serialization table external to the storage device 120. As shown, the manager 400 is performing the task of write serialization, where a number of VBAs (VBA-1, VBA-2, VB3, etc.) for writes to be performed sequentially in time are being serialized into a stripe 442. The manager may use a local memory buffer (e.g., non-volatile memory) to temporarily store the VBAs to be written in the stripe as it is being built. The stripe 442 is to be eventually written into storage devices 120, with individual chunks spread across the devices, and respectively at certain external LBAs of those devices. This task may be performed by the redundancy coding module 416 that was previously shown in FIG. 4.

Rather than maintaining a large mapping of VBAs to external LBAs as shown in FIG. 5C, the manager 400 adopts a different process to execute and track the serialized writes. Take the example of VBA-1, VBA-1 is fed to a function 440 that extracts the external LBA to be sent to the storage device for writing the VBA-1. The function to extract the external LBA from the VBA can be implemented in a number of ways, and can include a bit selection or a hash function. The same VBA-1 is also assigned, by virtue of the write serialization process, a device ID to ensure writes for the stripe are eventually spread across the storage devices. Thus, another VBA in the stripe may be assigned to be written to a different device, hence a different device ID.

In this case, let's assume VBA-1 is assigned the device ID for storage device 120-1. The DVT, which uses VBA as an index to entries of device ID, is thus updated to reflect this VBA-device ID pairing, and now, with (1) the device ID identifying storage device 120-1, and (2) the external LBA having been extracted from VBA-1, the data for VBA-1 has a complete write destination and can be sent to the storage device 120-1 for writing. The manager 400 may in this manner send write requests to the storage devices 120, for all the chunks in the stripe including any calculated parity chunk(s). To later read the same VBA-1, a simple lookup to the DVT will yield the assigned device ID, which along with the extracted LBA from the VBA-1, will allow access to the same data.

In addition to the DVT 410, the forward map 534 is also updated as part of the write process to reflect that VBA-1 belongs to the stripe being constructed. Note that one or more of the storage devices 120 may store a copy of the forward map 534. However, it is not required for all storage devices 120 to store a copy of the forward map 534. In one embodiment, two storage devices 120 store a copy of the forward map 534. In one embodiment, the forward map 534 is stored in non-volatile storage (e.g., in memory cells in array 126) on the non-volatile storage device 120. Hence, the entire forward map 534 is not required to be stored in DRAM of the manager 400 or storage device 120. The forward map 534 may be implemented in a variety of manners including, but are not limited to, an address translation table, a B-tree, or a log-structured merge tree.

As noted above, in one embodiment, a portion of the forward map 534 is cached 424 in a memory local to the manager 400. In this example, the SID (Stripe ID) entry slot corresponding to VBA-1 index is updated to contain the SID value assigned to the stripe 442 that is being constructed. Likewise, the slots indexed by other VBAs in the stripe, e.g., VBA-2 and VBA-3, will also be assigned the SID for stripe 442.

A sequence of the write requests have external LBAs, which may be random. For example, a sequence of the external LBAs may be randomly distributed in an address space of the host, as well as the storage devices themselves. The address mapping module 150 in the storage device 120 (example device 120-1 as shown) sequentializes the randomly distributed external LBAs, in one embodiment. In one embodiment, the mapping module 150 is configured to map random external LBAs in the write requests from the manager 400 that are received sequentially in time to sequential internal addresses (e.g., internal block addresses (BAs). In one embodiment, the mapping module 150 is configured to map random external LBAs in a request to write a chunk of data to sequential internal addresses (e.g., internal block addresses (BAs)). In one embodiment, the mapping module 150 is configured to map random external LBAs in the write requests that are received sequentially in time to physically sequential locations in the storage device 120. In one embodiment, the mapping module 150 is configured to map random external LBAs in a request to write a chunk of data to physically sequential locations in the storage device 120. In one embodiment, the sequential internal addresses are within the same erase block. The sequential internal addresses are physical addresses, in one embodiment. The sequential internal addresses are internal logical addresses, in one embodiment. The address mapping module 150 may be configured to store the mapping of random external LBAs to sequential internal LBAs in the address mapping storage 550.

The writing logic 552 may be configured to write the random writes in a contiguous region (such as all or a portion of an erase block). Note that the writing logic 552 may work in combination with the address mapping module 150, such that the random writes are written serially in the erase block. Serial writing in this context means that data blocks within the erase block are written in order of their physical addresses. The writing logic 552 may be implemented by elements including, but not limited to, one or more of state machine 112, on-chip address decoder 114, power control 116, read/write circuits 128, decoders 124, 132.

In some embodiments, the writing logic 552 is configured to move a chunk of data that is stored in a first contiguous region (e.g., first erase block) to a second contiguous region (e.g., second erase block) in the non-volatile storage device 120. This move may be for a variety of reasons including, but not limited to, wear leveling. The chunk may have the same internal logical address (e.g., ILBA) before and after the move. The address mapping module 150 may be configured to update, in the address mapping storage 550, a mapping of the internal logical address from the first contiguous region to the second contiguous region. For example, the mapping of the internal logical address could be changed from the first erase block (or some other unit) to the second erase block (or some other unit). Note that keeping the internal logical address the same after the move is an example of a "fixed internal address."

The internal address providing module 554 of storage device 120 is configured to provide an internal address at which the chunk of data was written, in one embodiment. In one embodiment, the internal address is a fixed internal address, which means that manager 400 can access the chunk of data written using the internal address, regardless of internal data movement that may be executed by the storage device 120. This internal address could be provided to the manager 400 to update the stripe map 422. In this case, the entry indexed by the SID assigned to the stripe map 422 would be updated to reflect that a first chunk of stripe 422 has been written at the internal address returned by storage device 120. In one embodiment, the returned internal address references the erase block at which VBA-1 was written. The stripe map, as further explained later, will facilitate error handling by enabling the manager 400 to access the chunks of a stripe if a device failure occurs. In addition, the stripe map also allows for the manager 400 to initiate garbage collection in a coordinated manner among the storage devices 120, since the manager 400 now can see what erase blocks are involved on a per stripe level. Valid data from erase blocks can then be garbage collected with respect to the stripe to which they belong.

One or more of the non-volatile storage devices 120 may store a copy of the stripe map 422, which may be provided by the manager 400. In one embodiment, a copy of the stripe map 422 is stored in non-volatile storage (e.g., in memory cells in array 126) on the non-volatile storage device 120. Therefore, if the copy of the stripe map 422 that is on the manager 400 is lost, it may be retrieved from the non-volatile storage device 120.

One or more of the non-volatile storage devices 120 may store a copy of the DVT 410, which may be provided by the manager 400. In one embodiment, a copy of the DVT 410 is stored in non-volatile storage (e.g., in memory cells in array 126) on the non-volatile storage device 120. Therefore, if the copy of the DVT 410 that is on the manager 400 is lost, it may be retrieved from the non-volatile storage device 120.

Figure 6:
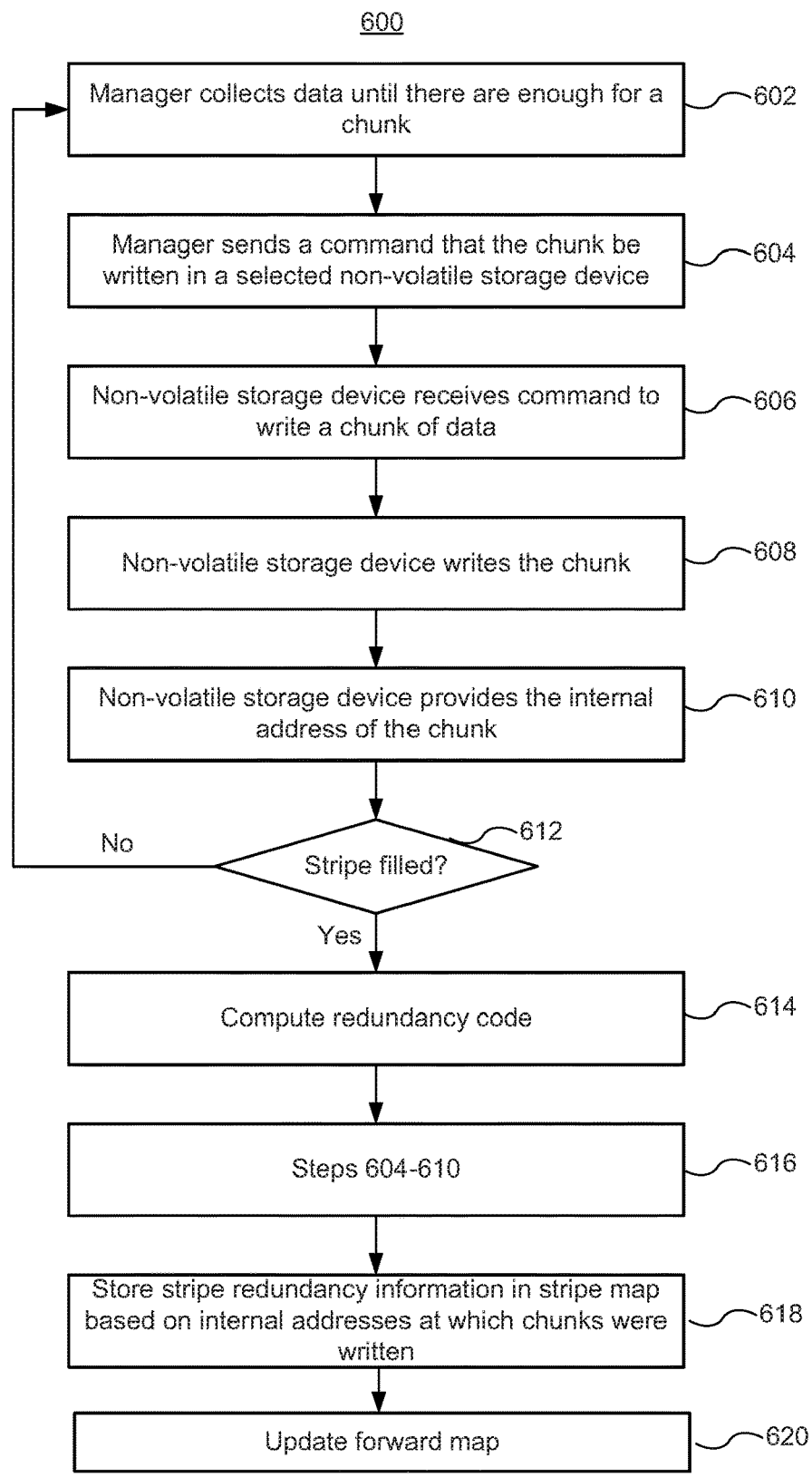
FIG. 6 is a flowchart of one embodiment of a process 600 of operating a non-volatile storage system.

FIG. 6 is a flowchart of one embodiment of a process 600 of operating a non-volatile storage system. The process 600 may be practiced in system 102 of FIG. 1A or 104 of FIG. 1B, but is not limited thereto. Some of the steps of process 600 may be practiced by manager system 400, as will be discussed in connection with various steps. Some of the steps of process 600 may be practiced in a non-volatile storage device 120, as will be discussed in connection with various steps.

Step 602 includes the manager 400 collecting data for a chunk in a redundancy coding stripe. This data may all random data, all sequential data, or some combination of random and sequential data. In at least some cases, the data is all random data. In one embodiment, step 602 is performed by data collecting module 402.

Step 604 includes the manager 400 sending a command that the chunk of data be written in a selected non-volatile storage device 120. In one embodiment, the command instructs the non-volatile storage device 120 to write the entire chunk in a contiguous region. In one embodiment, the command instructs the non-volatile storage device 120 to write the entire chunk in an erase block. In one embodiment, the chunk is the size of an erase block. However, the chunk could be smaller than an erase block. Also, the chunk could be larger than an erase block. In one embodiment, step 604 is performed by command module 404.

Step 606 includes the selected non-volatile storage device 120 receiving the command to write the chunk of data. In one embodiment, host interface 220 in front end module (see FIG. 2B) receives the command.

Step 608 includes the selected non-volatile storage device 120 writing the chunk of data. In one embodiment, the selected non-volatile storage device 120 writes the entire chunk within an erase block. The chunk may completely fill the erase block, but this is not required. In some cases, the chunk may substantially fill the erase block. In one embodiment, the selected non-volatile storage device 120 writes the entire chunk within a contiguous group of non-volatile memory cells. The contiguous group of non-volatile memory cells have a contiguous range of physical addresses, in one embodiment. In one embodiment, writing logic 552 performs step 608.

Step 610 includes the selected non-volatile storage device 120 providing an internal address at which the chunk was written. In one embodiment, this is an address of an erase block. This could be the actual physical address of the erase block, but is not required to be. In one embodiment, this is a logical address of the erase block. In one embodiment, internal address providing module 554 performs step 610.

Figure 7:
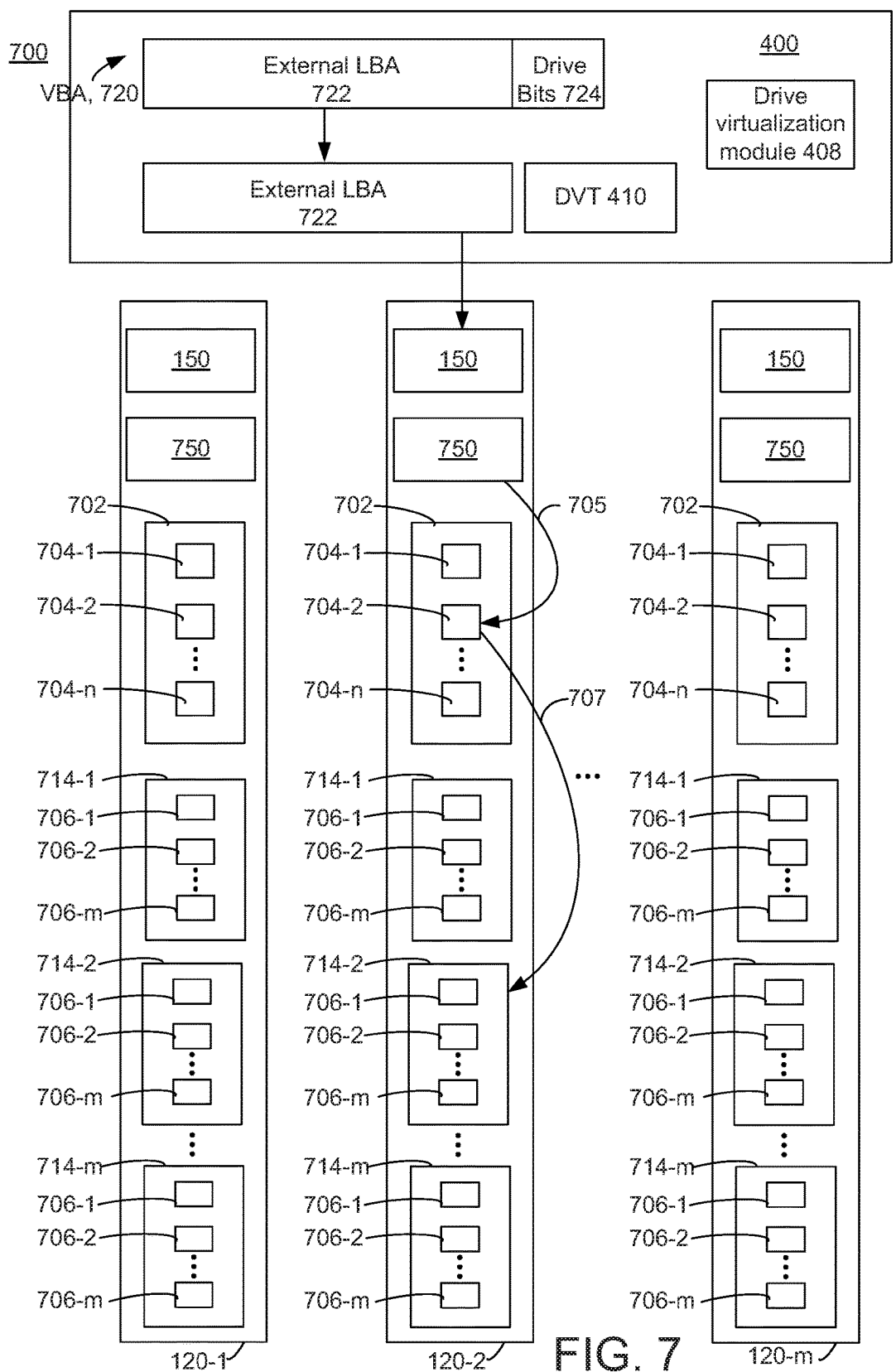
FIG. 7 provides further details of one embodiment of physical and logical addresses of erase blocks.

FIG. 7 provides further details of one embodiment of physical and logical addresses of erase blocks. Note that the internal address is not necessarily the address of an erase block. For example, the internal address could be based on an offset within an erase block. Offsets within erase blocks are also discussed in connection with FIG. 7. Note that the internal address may be a fixed internal address.

Returning again to the discussion of process 600, step 612 is a determination of whether the redundancy stripe is filled. Here, a full stripe means full with data excluding the redundancy code (e.g., parity). The next time through the process 600, the manager 400 may select a different non-volatile storage device 120 to write a chunk a data. When the stripe is full (excluding the redundancy code), then the manager 400 may compute the redundancy code, in step 614. Steps 614-610 may be repeated to store the redundancy code chunk to one of the non-volatile storage devices 120. Note that there could be more than one redundancy code chunk (stored to more than one non-volatile storage device). In one embodiment, redundancy coding module 416 performs step 612.

Step 618 includes storing redundancy information in a stripe map 422. Step 618 may be based on the internal addresses at which the chunks were written. FIG. 5B depicts an example entry for a stripe map 422. If the SID is "12", then "12 may be written to the redundancy stripe identifier 515. The example stripe map entry is consistent with the example redundancy stripe 502 in FIG. 5A. In this example, there is one internal address 516 for each chunk. For example, internal address 516(0) is for chunk 504(0), internal address 516(1) is for chunk 504(1), and internal address 516(m−1) is for chunk 504(m−1). The internal addresses 516 refer to those returned by the storage devices in step 610. In one embodiment, redundancy coding module 416 performs step 618.

Step 620 is updating the forward map 534. Using the current VBA as in index, the value of the SID is written into the slot indexed by the VBA, in one embodiment. For example, if the current SID is "12," and two VBAs, VBA "1" and VBA "10" are in the stripe, then the value "12" is written into the slot indexed by VBA "1" and also into the slot indexed by VBA "10." In step 620, the forward map cache 424 on manager 400 may be updated. Also, the persistent copies of the forward map 534 on the storage devices 120 may be updated by the manager 400 writing directly to the appropriate storage device 120. As noted above, the copies of the forward map 534 on the storage devices 120 may be stored in non-volatile storage such as array 126.

FIG. 7 depicts one embodiment of a non-volatile memory system 700. The system 700 has a manager 400 and a number of non-volatile storage devices 120-1 through 120-m. In one embodiment, the non-volatile memory system 700 obviates the need for a large write serialization table external to the storage devices 120. In general, the manager 400 may start with a virtual block address (VBA) 720 received from, for example, a software application (not depicted in FIG. 7). The VBA 720 includes an external LBA 722 and drive bits 724, in this example. The drive bits 724 are one or more bits that are in addition to the external LBA 722. The manager 400 may pass the external LBA to one of the storage devices 120, as will be explained more fully below. However, the drive bits do not necessarily point to one of the storage devices 120. A possible reason for this is that the manager 400 may load balance writes across the storage devices 120. Another possible reason is that the manager 400 may select storage devices to write to in order to compose redundancy stripes. Note that addresses are referred to as "block" addresses in FIG. 7 for purpose of illustration. A block may be any size. In one embodiment, the manager 400 specifies the block size for write and/or read operations.

In one embodiment, the drive virtualization table 410 contains a mapping from the VBA 720 to one of the storage devices 120. When a write to a VBA is received, the drive virtualization module 408 may determine a storage device 120 to which the write should be sent. The drive virtualization module 408 may create (or update) an entry in the drive virtualization data structure 410 that links the VBA to a unique identifier for the storage device 120. In one embodiment, the drive virtualization data structure 410 includes an address mapping table that maps from VBA to address of a storage device. Note that this unique identifier is not necessarily the drive bits in the VBA. However, one option is to simply use the drive bits in the VBA to identify the storage device 120 to be written.

Each storage device 120 has an address mapping module 150, external LBA (ELBA) to internal LBA (ILBA) mapping structure 750, an erase block virtualization structure 702, and a number of erase blocks 714-1 through 714-m, in one embodiment. Arrow 705 represents a mapping from an external logical address to an internal logical address. Arrow 707 represents a mapping from the internal logical address to a physical address. The erase block virtualization structure 702 is not required. Thus, in one embodiment, mapping goes directly from an external logical address to a physical address.

The ELBA to ILBA mapping structure 750 could include a table, B-tree, etc. The erase block virtualization structure 702 could include a table, B-tree, etc. Such mapping structures 702, 750 may be stored in non-transitory storage within a non-volatile storage device 120. The mapping structures 702, 750 may be stored in volatile or non-volatile storage. Note that the storage devices 120 may employ a common internal addressing scheme.

In one embodiment, each erase block contains a group of non-volatile memory cells that are erased as one unit. An erase block is the smallest unit of memory cells that are erased, in one embodiment. Each of the erase blocks 714 has a number of data blocks 706-1 through 706-m. In one embodiment of step 608, the storage device 120 writes units (e.g., blocks) of the chunk to data blocks in a sequential order. For example, the data blocks 706 are written in order of their physical addresses, in one embodiment. In one embodiment, the size of the data blocks 706 is dictated by the manager 400. For example, the host 115 may specify the amount of data to be written or read for a given ELBA.

Figure 7A:
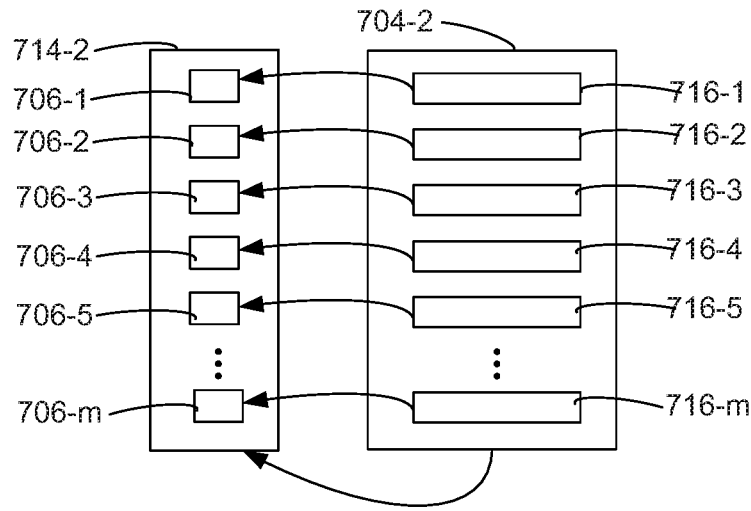
FIG. 7A depicts further details of entry 704-2 from FIG. 7, showing offsets 716-1 through 716-m.

The erase block virtualization data structure 702 has entries 704-1 through 704-n, each of which points to one erase block 714. The arrow from entry 704-2 to erase block 714-2 in storage device 120-2 represents one such pointer. Each of the entries 704 has offsets, in one embodiment. FIG. 7A depicts further details of entry 704-2, showing offsets 716-1 through 716-m. Each offset 716 references one of the data blocks 706-1 through 706-m in erase block 714-2. Note that the entry 704-2 could be made to point to a different physical erase block 714, in which case the offsets 716 will then reference the data blocks 706 in the new erase block 714.

In one embodiment, an ILBA is a specific entry and offset in the erase block virtualization data structure 702. Each of the offsets in the erase block virtualization data structure 702 may reference a specific data block 706. Each data block 706 may have a physical block address (PBA). Thus, each ILBA may reference a specific PBA. In the event that the storage device 120 moves the data in a data block 706 to another data block, the address mapping module 150 may update ILBA.

Figure 8:
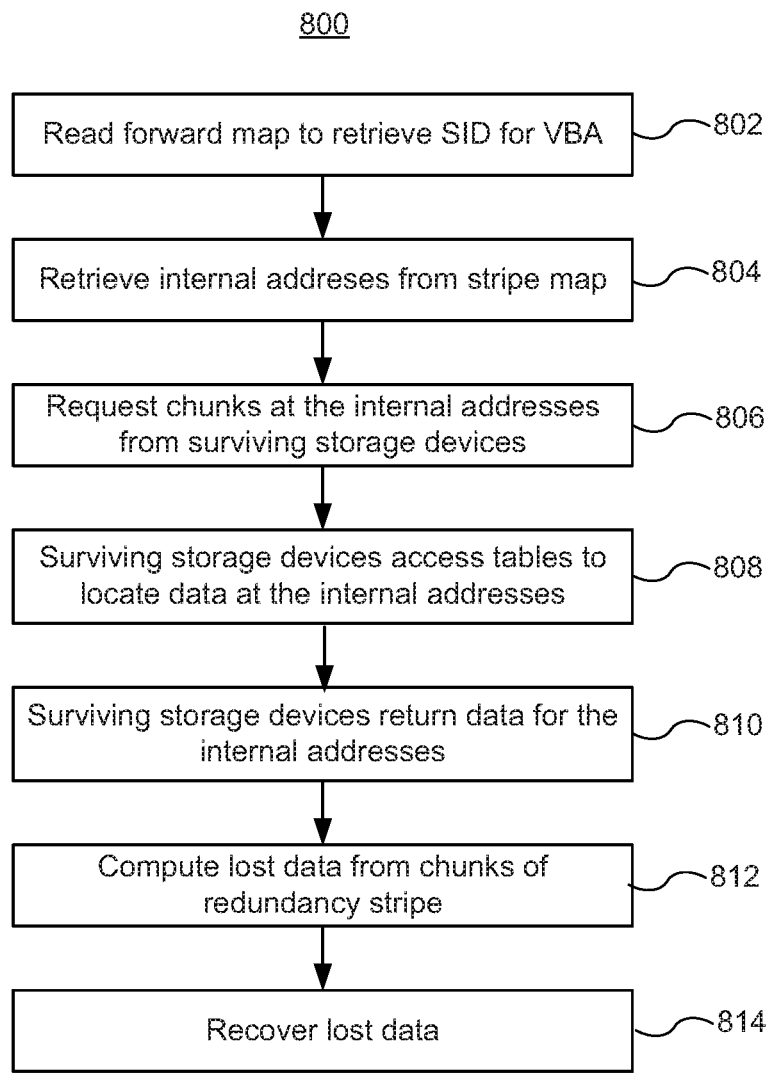
FIG. 8 is a flowchart of one embodiment of a process of recovering lost data for an ELBA using chunks in a redundancy stripe.

Note that in some embodiments data for a VBA 720 is read from a storage device 120 by the storage device 120 using the address mapping module 150, mapping structure 750, and erase block virtualization structure 702. For example, the manager 400 may start with a VBA 720, and extract an external LBA 722. As noted in the discussion of FIG. 5D, the manager 400 may use the VBA 720 to lookup the device ID in the DVT 410. Thus, the manager 400 may send the ELBA 722 to the correct storage device 120 that stores the data for the VBA 720. Once the storage device 120 receives the ELBA 722, the storage device 120 may use address mapping module 150, mapping structure 750, and erase block virtualization structure 702 to locate the data for the ELBA 722. Note that in some embodiments, a copy of mapping structure 750, and erase block virtualization structure 702 are maintained in RAM 122b on controller 122. Also note that it is not required to use the forward map 534 for a normal read. This allows the forward map 534 to be maintained in the memory structure 126, thereby freeing up a portion of RAM 122b, in some embodiments. In some embodiments, the forward map 534 is used in data recovery. FIG. 8 has further details of embodiments of using the forward map 534 in data recovery.

Figure 7C:
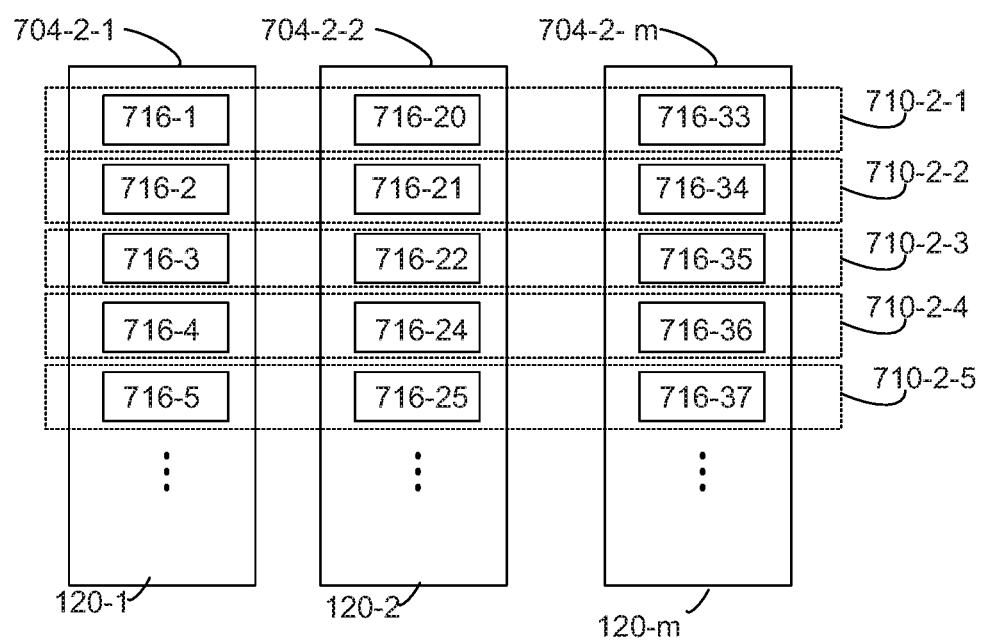
FIG. 7C depicts one embodiment in which each chunk of a redundancy stripe is a single data block.
Figure 7B:
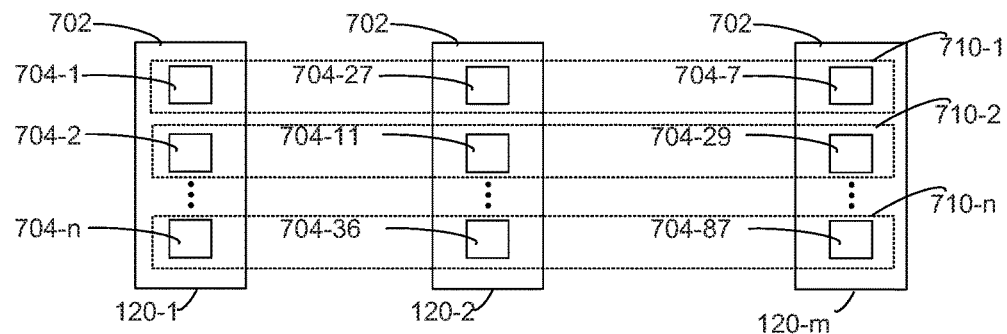
FIG. 7B depicts one example of redundancy stripes for based on entries in one embodiment of an erase block virtualization data structure.

FIG. 7B depicts one example of redundancy stripes based on entries in one embodiment of an erase block virtualization data structure 702. A number of redundancy stripes 710-1 through 710-n are depicted. Each redundancy stripe 710 is formed from one chunk of data on each non-volatile storage device 120-1, 120-2, 120-m. In this example, there are three non-volatile storage devices 120, but there could be more or fewer. Redundancy stripe 710-1 is formed based on entry 704-1 on storage device 120-1, entry 704-27 on storage device 120-2 and entry 704-7 on storage device 120-m. In one embodiment, the entries 704 are the internal addresses provided by the storage devices 120 in step 610 of process 600. Thus, in one embodiment, the manager 400 stores these entries in a stripe map 422. FIG. 7A shows two other example redundancy stripes 710. Redundancy stripe 710-2 is formed based on entry 704-2 on storage device 120-1, entry 704-11 on storage device 120-2 and entry 704-29 on storage device 120-m. Redundancy stripe 710-n is formed based on entry 704-n on storage device 120-1, entry 704-36 on storage device 120-2 and entry 704-87 on storage device 120-m. Each of the entries 704 points to an erase block, in one embodiment. In this example, each chunk is one erase block in size. However, a chunk could be larger or smaller than one erase block in size.

FIG. 7C depicts one embodiment in which each chunk of a redundancy stripe 710 is a single data block 706. FIG. 7C depicts a portion of an erase block virtualization data structure 702 on three different storage devices 120-1, 120-2, and 120-*m*. In particular one entry 704 is depicted for each storage device. Entry 704-2-1 is depicted for storage device 120-1, entry 704-2-2 is depicted for storage device 120-3, and entry 704-2-*m* is depicted for storage device 120-*m*. Recall that, in one embodiment, each entry 704 points to one erase block 714. Several offsets 716 are depicted in each entry 704. Recall that from FIG. 7A that each offset 716 may point to one data block 706.

FIG. 7C shows redundancy coding stripe 710-2-1 formed from offset 716-1 of entry 704-2-1 on storage device 120-1, offset 716-20 of entry 704-2-2 on storage device 120-1, and offset 716-33 of entry 704-2-*m* on storage device 120-*m*. Thus, in this example, the redundancy coding stripe 710-2-1 is formed from different offsets into the entry. This means that the redundancy coding stripe 710 may be formed from different physical locations in the erase blocks 714. However, it is also possible that the offset 716 for a given redundancy coding stripe 710 is the same on each storage device 120.

In one embodiment, when a storage device 120 is requested to write a chunk of data in process 600, the storage device 120 returns an address that corresponds to an offset 716 in an entry 704. For example, the storage device 120 may return an ILBA (where the ILBA is not required to point to the beginning an erase block 714). This allows the manager 400 to compose a stripe map 422 at the granularity of one data block 706. Note that if the storage device 120 were to move the chunk of data that was originally stored in the data block (on its own volition), the storage device 120 may update the mapping in the erase block virtualization data structure 702 such that the internal address that it returned will now point to where the chunk of data has been moved. This movement could be to another erase block 714, or to a different data block 706 within an erase block 714.

Figure 7D:
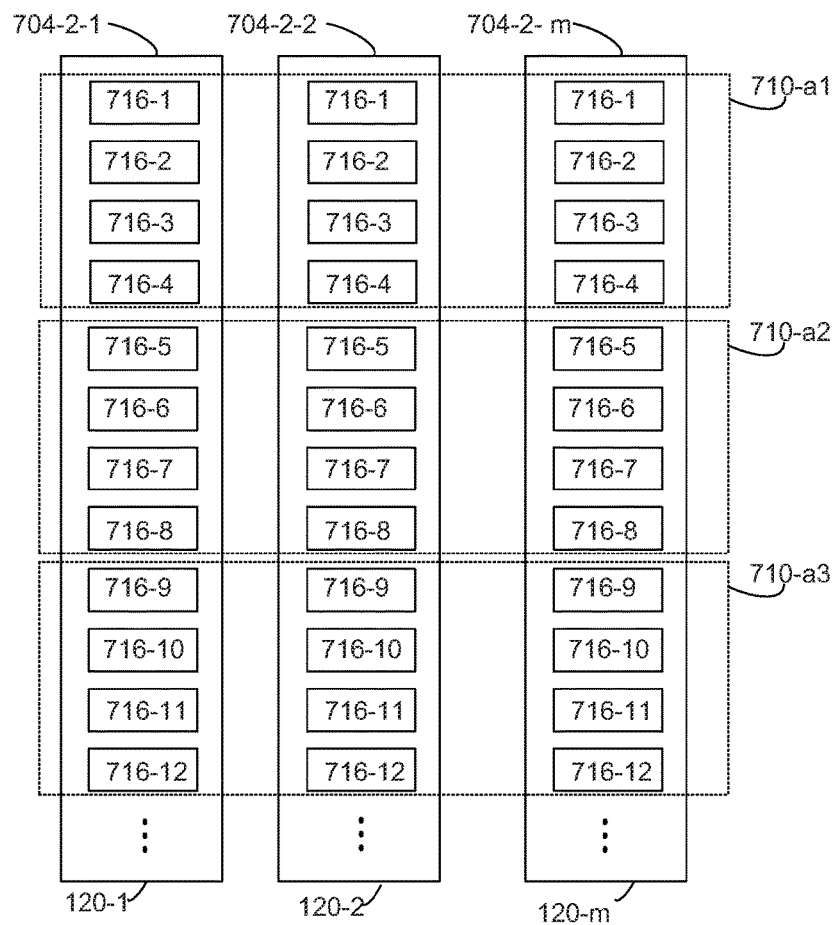
FIG. 7D is another example of redundancy coding stripes.

FIG. 7D is yet another example of redundancy coding stripes 710. In this example, each redundancy coding stripe 710 has a chunk size of four data blocks 706 (due to the correspondence between the offsets 716 and data blocks 706, as depicted in FIG. 7A). For example, offsets 716-1, 716-2, 716-3 and 716-4 could describe one chunk for redundancy coding stripe 710-*a*1, as depicted in FIG. 7D. In one embodiment, the storage device 120 returns an ILBA for the beginning of the chunk, in step 610 of process 600. For example, when writing a chunk for redundancy coding stripe 710-*a*1, storage device 120-1 may return an ILBA for entry 704-2-1 at offset 716-1; when writing a chunk for redundancy coding stripe 710-*a*2, storage device 120-1 may return an ILBA for entry 704-2-1 at offset 716-5. The storage device 120 may return the ILBA to the manager 400. The manager 400 may use these ILBAs to compose a stripe map 422. In the example of FIG. 7D, each storage device 120 uses the same offsets for a given chunk (but possible different entries). However, it is not required that the same offsets be used for each chunk of a given redundancy coding stripe 710.

Note that in the example of FIG. 7D, the offsets within each data chunk are ordered sequentially. In one embodiment, various offsets 716 correspond to random writes. The non-volatile storage device 120 orders these random writes sequentially in one embodiment. Note that the offsets 716 may be sequential. Hence, the internal addresses may be sequential.

FIG. 8 is a flowchart of one embodiment of a process 800 of recovering lost data for a VBA using chunks in a redundancy stripe. The process 800 can be used to recover data if an attempt to read data on a storage device 120 for some VBA fails, without the entire storage device 120 failing. This process 800 can also be used to recover data if one of the storage devices 120 fails. In process 800, an example will be discussed in which there are three "surviving storages devices" with data at some VBA lost for one storage device 120. For simplicity, just one VBA is discussed, but process 800 can be used to recover data for many VBAs. In one embodiment, process 800 is performed by data recovery module 418 in manager 400. In one embodiment, process 800 is used when process 600 was used to store a stripe map. In one embodiment, process 800 is used when process 600 was used to store a stripe map 422 that identifies internal addresses of chunks that were provided by storage devices 120 in step 610 of process 600. In one embodiment, process 800 is used when process 600 was used to update a forward map 534.

Step 802 is to read a copy of the forward map 534 to retrieve the SID for the VBA. The manager 400 may read one of the copies of the forward map 534 stored in one of the storage devices 120. In some cases, the forward map cache 424 may contain the SID for the VBA, in which case a read of a storage device 120 is not needed. Note that if a storage device 120 has failed, SIDs for many VBAs may be retrieved in step 802. Steps 804-814 may be performed for each SID.

Step 804 is to use the stripe map 422 to retrieve the internal addresses of the chunks for the SID. With reference to the example of FIG. 5B, the internal addresses ILBA 0, ILBA 1 . . . ILBA m−1 may be accessed. Note that the stripe map 422 on the manager 400 may be accessed in step 804.

Step 806 includes requesting chunks of the redundancy stripe from each surviving storage device 120. For the sake of example, there are three surviving storage devices 120-1, 120-2, and 120-*m*. As one example, the manager 400 sends a request to storage device 120-1 for a chunk of data at ILBA 516(0), sends a request to storage device 120-1 for a chunk of data at ILBA 516(1), and sends a request to storage device 120-*m* for a chunk of data at ILBA 516(*m*−1).

Step 808 includes the surviving storage devices (e.g., 120-1, 120-2, and 120-*m*) accessing mapping data structures to access data at the ILBAs. In the present example, storage device 120-1 determines where the data for ILBA 516(0) is physically stored. In the present example, storage device 120-2 determines where the data for ILBA 516(1) is physically stored. In the present example, storage device 120-*m* determines where the data for ILBA 516(*m*−1) is physically stored.

In step 810, the surviving storage devices return the data for the requested internal addresses to the manager 400.

Step 812 includes computing the lost data from the data chunks returned in step 810.

Step 814 includes restoring the lost data. The data might be restored to storage device 120-3 (which lost the data), or restored to some other storage device 120.

Figure 9:
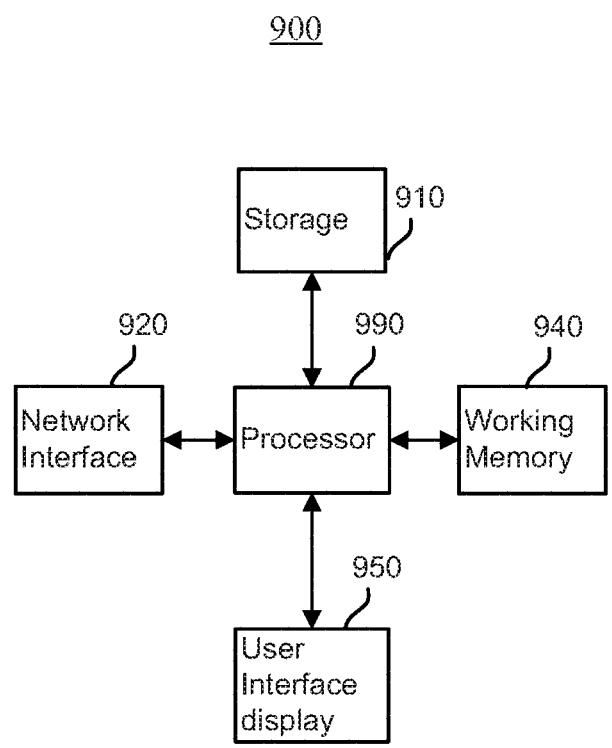
FIG. 9 illustrates a schematic diagram of an example computer system.

FIG. 9 illustrates a schematic diagram of a computer system 900 that may be used to implement one embodiment of host 115, main controller 130, or manager 400. The computing system 900 includes a storage device 910 such as a hard disk or portable media, a network interface 920 for communicating with other computing systems, a processor 930 for executing software instructions, a working memory 940 such as RAM for storing the software instructions after they are loaded from the storage device 310, for instance, and a user interface display 950 such as one or more video monitors. The processor 990 may be implemented as one or more CPU chips, cores (e.g., a multi-core processor), FPGAs, ASICs, and/or DSPs, and/or may be part of one or more ASICs. A user interface can be provided as one or more monitors. The storage device 910 and working memory 940 may be considered to be a tangible, non-transitory processor- or computer-readable storage device having processor readable code embodied thereon for programming the processor 930 to perform methods for providing the functionality discussed herein. The user interface display 950 can use any known display scheme, whether graphical, tabular or the like. In addition to an on-screen display, an output such as a hard copy such from a printer can be provided.

In some embodiments, data collecting module 402, command module 4040, redundancy coding module 416, data recovery module 418, and/or drive virtualization module 408 are implemented by executing instructions on processor 990. The instructions may be stored in storage 910 or working memory 940. Thus, at least some steps in process 600 or 800 may be implemented by executing instructions on processor 990.

A first embodiment disclosed herein includes a system comprising: non-transitory storage; a data collecting module configured to collect, for each chunk of a redundancy coding stripe, data for the chunk; a command module configured to issue a command to write the data for the chunk of the redundancy coding stripe in a selected of a plurality of non-volatile storage devices; an interface configured to receive, for each chunk of the redundancy coding stripe, an internal address of the chunk in the selected non-volatile storage device; and a redundancy coding module configured to store into the non-transitory storage a redundancy stripe map having a redundancy stripe identifier and the internal addresses in the non-volatile storage devices for the chunks of the redundancy coding stripe.

In a second embodiment, and in accordance with the first embodiment, the system further includes an data recovery module configured to send a request to a first of the non-volatile storage devices for a chunk of the redundancy coding stripe, the request specifies the internal address of the chunk.

In a third embodiment, and in accordance with the first or second embodiments, the system further includes logic configured to instruct at least one of the plurality of non-volatile storage devices to store, into non-volatile storage, a forward map that maps from virtual addresses to redundancy stripe identifiers.

In a fourth embodiment, and in accordance with the third embodiment, the data recovery module is further configured to: read the forward map from the non-volatile storage on a non-volatile storage device to retrieve a redundancy stripe identifier for a virtual address; use the retrieved redundancy stripe identifier to retrieve internal addresses in the redundancy stripe map; and request chunks of data from ones of the non-volatile storage devices, the requests for the chunks specifying the retrieved internal addresses.

In a fifth embodiment, and in accordance with the first through fourth embodiments, each of the chunks of data comprise a plurality of blocks of random data each with an external logical address. A first of the non-volatile storage devices comprises: an address mapping module configured to map the external logical addresses associated with a chunk of data to sequential internal addresses in the first non-volatile storage device; and store the mapping in non-transitory storage in the first non-volatile storage device.

In a sixth embodiment, and in accordance with the first through fifth embodiments, a first of the non-volatile storage devices comprises: writing logic configured to write the entire chunk of the redundancy coding stripe to a contiguous region of non-volatile memory cells in the first non-volatile storage device; and address providing logic configured to provide, to the interface, an internal address at which the chunk was written in the first non-volatile storage device.

In a seventh embodiment, and in accordance with the first through sixth embodiments, the internal address that a first of the plurality of non-volatile storage devices provides for a first chunk in the redundancy coding stripe is a first internal logical address.

In an eighth embodiment, and in accordance with the first through seventh embodiments, the first non-volatile storage device further comprises: non-transitory storage; writing logic configured to move the first chunk that is stored in a first contiguous region in the first non-volatile storage device to a second contiguous region in the first non-volatile storage device; and an address mapping module configured to update, in the non-transitory storage, a mapping of the first internal logical address from the first contiguous region to the second contiguous region.

In a ninth embodiment, and in accordance with the eighth embodiment, the first contiguous region is all or a portion of a first erase block in the first non-volatile storage device, wherein the second contiguous region is all or a portion of a second erase block in the first non-volatile storage device.

In a tenth embodiment, and in accordance with the first through ninth embodiments, each of the chunks of data comprise a plurality of blocks of random data each with an external logical block address. The system further comprises drive virtualization logic configured to: for each virtual block address associated with one of the external logical block addresses sent in a write request to one of the plurality of non-volatile storage devices, convert the virtual block address to one of the external logical block addresses and an identifier of one of the plurality of non-volatile storage devices.

In an eleventh embodiment, and in accordance with the first through tenth embodiments, the command to write the data for the chunk of the redundancy coding stripe in the selected one of the plurality of non-volatile storage devices instructs the selected non-volatile storage device to write the entire chunk within all or a portion of an erase block.

One embodiment disclosed herein includes a method comprising: receiving, at each of a plurality of non-volatile storage devices, a request to write a chunk of a redundancy coding stripe; writing, by each of the non-volatile storage devices, the entire chunk to a contiguous region of non-volatile memory cells in the respective non-volatile storage device; providing, by each of the non-volatile storage devices, a fixed internal address of the chunk in an internal address space of the respective non-volatile storage device; and storing a redundancy stripe map into non-transitory storage, the redundancy stripe map having a redundancy stripe identifier and the fixed internal addresses for the chunks for the redundancy coding stripe.

One embodiment disclosed herein includes a non-volatile storage system comprising: non-transitory storage; data collecting means for collecting random writes for each chunk of a redundancy coding stripe; command means for sending, to each of a plurality of non-volatile storage devices, a command to write one of the chunks of random writes within a contiguous region of the non-volatile storage device; writing means for writing each respective chunk of the redundancy coding stripe in a contiguous region of non-volatile memory cells in each respective non-volatile storage device; address providing means for providing, for each of the chunks, an internal address at which the chunk was written in the respective non-volatile storage device; and redundancy coding means for storing into the non-transitory storage a redundancy stripe map having a redundancy stripe identifier and the internal addresses for the chunks for the redundancy coding stripe.

In one embodiment, the data collecting means includes one or more of data collecting module 402, CPUs 300, memory 306, processor 990, working memory 940 and/or storage 910, but is not limited thereto.

In one embodiment, the command means includes one or more of data command module 404, CPUs 300, memory 306, processor 990, working memory 940 and/or storage 910, but is not limited thereto.

In one embodiment, the writing means includes one or more of writing logic 552, state machine 112, on-chip address decoder 114, power control 116, read/write circuits 128, decoders 124, 132, but is not limited thereto.

In one embodiment, the address providing means includes one or more of data internal address providing module 554, front end module 208, host interface 220, PHY 222. but is not limited thereto.

In one embodiment, the redundancy coding means includes one or more of redundancy coding module 416, CPUs 300, memory 306, processor 990, working memory 940 and/or storage 910, but is not limited thereto.

Numerous details are described herein to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A system comprising:
    a plurality of non-volatile storage devices, wherein each non-volatile storage device comprises:
        a device controller; and
        a plurality of non-volatile memory cells configured with internal addresses;
    non-transitory storage;
    a data collecting module configured to collect, for each chunk of a redundancy coding stripe, data for the chunk;
    a command module configured to issue a command to write the data for the chunk of the redundancy coding stripe to a selected non-volatile storage device of the plurality of non-volatile storage devices using a virtual block address;
    an interface configured to receive, for each chunk of the redundancy coding stripe, an internal address of the chunk in the selected non-volatile storage device from the selected non-volatile storage device; and
    a redundancy coding module configured to store into the non-transitory storage a redundancy stripe map having a redundancy stripe identifier and the internal addresses in the non-volatile storage devices for the chunks of the redundancy coding stripe.

2. The system of claim 1, further comprising a data recovery module configured to:
    send a request to a first non-volatile memory device of the plurality of non-volatile storage devices for a chunk of the redundancy coding stripe, wherein the request specifies the internal address of the chunk.

3. The system of claim 1, further comprising logic configured to instruct at least one non-volatile storage device of the plurality of non-volatile storage devices to store, into non-volatile storage in the at least one non-volatile storage device, a forward map that maps from virtual block addresses to redundancy stripe identifiers.

4. The system of claim 3, further comprising a data recovery module configured to:

read the forward map from the non-volatile storage in a non-volatile storage device to retrieve a redundancy stripe identifier for a target virtual block address;
use the retrieved redundancy stripe identifier to retrieve internal addresses for target chunks in the plurality of non-volatile storage devices from the redundancy stripe map; and
request target chunks of data from the plurality of non-volatile storage devices, the requests for the target chunks specifying the retrieved internal addresses.

5. The system of claim 1, wherein:
each of the chunks of data comprises a plurality of blocks of random data, wherein each of the plurality of blocks has an external logical address; and
a first of the plurality of non-volatile storage devices further comprises:
an address mapping module configured to:
map the external logical addresses associated with a chunk of data to sequential internal addresses in the first non-volatile storage device; and
store the mapping in non-transitory storage in the first non-volatile storage device.

6. The system of claim 1, wherein a first non-volatile storage device of the plurality of non-volatile storage devices comprises:
writing logic configured to write the entire chunk of the redundancy coding stripe to a contiguous region of the plurality of non-volatile memory cells in the first non-volatile storage device; and
address providing logic configured to provide, to the interface, the internal address at which the chunk was written in the first non-volatile storage device.

7. The system of claim 1, wherein the internal address that a first non-volatile storage device of the plurality of non-volatile storage devices provides for a first chunk in the redundancy coding stripe is a first internal logical address.

8. The system of claim 7, wherein the first non-volatile storage device further comprises:
non-transitory storage;
writing logic configured to move the first chunk that is stored in a first contiguous region of the plurality of non-volatile memory cells in the first non-volatile storage device to a second contiguous region of the plurality of non-volatile memory cells in the first non-volatile storage device; and
an address mapping module configured to update, in the non-transitory storage of the first non-volatile storage device, a mapping of the first internal logical address from the first contiguous region to the second contiguous region.

9. The system of claim 8, wherein:
the first contiguous region is all or a portion of a first erase block in the first non-volatile storage device; and
the second contiguous region is all or a portion of a second erase block in the first non-volatile storage device.

10. The system of claim 1, wherein each of the chunks of data comprises a plurality of blocks of random data each with an external logical block address, and further comprising drive virtualization logic configured to:
for each virtual block address associated with one of the external logical block addresses sent in a write request to one of the plurality of non-volatile storage devices, convert the virtual block address to one of the external logical block addresses and an identifier of one of the plurality of non-volatile storage devices.

11. The system of claim 1, wherein the command to write the data for the chunk of the redundancy coding stripe in the selected non-volatile storage device instructs the selected non-volatile storage device to write the entire chunk within all or a portion of an erase block.

12. A method comprising:
receiving, at each of a plurality of non-volatile storage devices, a request to write a chunk of a redundancy coding stripe;
writing, by each of the plurality of non-volatile storage devices, the entire chunk to a contiguous region of non-volatile memory cells in the respective non-volatile storage device;
providing, by each of the plurality of non-volatile storage devices, a fixed internal address of the chunk in an internal address space of the respective non-volatile storage device;
sending, by each of the plurality of non-volatile storage devices, the fixed internal address to a manager system including non-transitory storage; and
storing a redundancy stripe map into non-transitory storage, the redundancy stripe map having a redundancy stripe identifier and the fixed internal addresses for the chunks for the redundancy coding stripe.

13. The method of claim 12, further comprising:
sending, from the manager system, a request to a first non-volatile storage device of the plurality of non-volatile storage devices for a chunk of the redundancy coding stripe, wherein the request specifies the fixed internal address of the chunk.

14. The method of claim 13, further comprising:
instructing at least one non-volatile storage device of the plurality of non-volatile storage devices to store, into non-volatile storage in the at least one non-volatile storage device, a forward map that maps from virtual block addresses to redundancy stripe identifiers.

15. The method of claim 14, further comprising:
reading the forward map from the non-volatile storage in the at least one non-volatile storage device to retrieve a redundancy stripe identifier for a virtual block address;
using the retrieved redundancy stripe identifier to retrieve fixed internal addresses in the redundancy stripe map; and
requesting chunks of data from the plurality of non-volatile storage devices, the requests for the chunks specifying the retrieved fixed internal addresses.

16. The method of claim 12, further comprising:
collecting, by the manager system, random writes for each of the chunks of the redundancy coding stripe; and
sending, by the manager system, commands to write all of the random writes for each of the chunks in a contiguous region on each of the plurality of non-volatile storage devices.

17. The method of claim 16, wherein the contiguous region is an erase block.

18. A non-volatile storage system comprising:
a plurality of non-volatile storage devices, wherein each non-volatile storage device comprises:
a device controller; and
a plurality of non-volatile memory cells configured with internal addresses;
non-transitory storage;
data collecting means for collecting random writes for each chunk of a redundancy coding stripe;
command means for sending, to each of the plurality of non-volatile storage devices, a command to write one of the chunks of random writes within a contiguous region of the plurality of non-volatile memory cells in each respective non-volatile storage device;

writing means for writing each respective chunk of the redundancy coding stripe in a contiguous region of the plurality of non-volatile memory cells in each respective non-volatile storage device;

address providing means for providing, for each of the chunks, an internal address at which the chunk was written in the respective non-volatile storage device; and redundancy coding means for storing into the non-transitory storage a redundancy stripe map having a redundancy stripe identifier and the internal addresses for the chunks for the redundancy coding stripe.

19. The non-volatile storage system of claim 18, wherein the writing means is further for:

writing a forward map to non-volatile memory in a first non-volatile storage device of the plurality of non-volatile storage devices, wherein the forward map translates from virtual block addresses to redundancy stripe identifiers.

20. The non-volatile storage system of claim 19, further comprising data recovery means for:

reading the forward map from the non-volatile storage in the first non-volatile storage device to retrieve a redundancy stripe identifier for a virtual block address;

using the retrieved redundancy stripe identifier to retrieve internal addresses in the redundancy stripe map;

requesting chunks of data from the plurality of non-volatile storage devices, the requests for the chunks specifying the retrieved internal addresses; and recovering a chunk of a redundancy coding stripe based on chunks returned from the plurality of non-volatile storage devices in response to the requests specifying the retrieved internal addresses.

* * * * *